United States Patent [19]

Hama et al.

[11] Patent Number: 5,716,451
[45] Date of Patent: Feb. 10, 1998

[54] PLASMA PROCESSING APPARATUS

[75] Inventors: Kiichi Hama, Chino; Toshiaki Hongoh, Yamanashi-ken; Yasuyuki Kuriki, Tokyo, all of Japan

[73] Assignee: Tokyo Electron Limited, Tokyo, Japan

[21] Appl. No.: 689,780

[22] Filed: Aug. 14, 1996

[30] Foreign Application Priority Data

| Aug. 17, 1995 | [JP] | Japan | 7-233333 |
| Aug. 31, 1995 | [JP] | Japan | 7-246607 |
| Apr. 23, 1996 | [JP] | Japan | 8-127941 |

[51] Int. Cl.$^6$ ............................................. C23C 16/00
[52] U.S. Cl. ................................. 118/723; 118/723 IR
[58] Field of Search .......................... 118/723 I, 723 IR, 118/723 MP, 723 E, 723 ER; 156/345; 216/68, 70, 21

[56] References Cited

U.S. PATENT DOCUMENTS

| 5,514,246 | 5/1996 | Blalock | 156/643.1 |
| 5,522,934 | 6/1996 | Suzuki et al. | 118/723 |
| 5,525,159 | 6/1996 | Hama et al. | 118/723.1 |
| 5,529,657 | 6/1996 | Ishii | 156/345 |
| 5,531,834 | 7/1996 | Ishizuka et al. | 118/723.1 |

FOREIGN PATENT DOCUMENTS

| 0 596 551 | 5/1994 | European Pat. Off. |
| 0 648 069 | 4/1995 | European Pat. Off. |
| 0 651 427 | 5/1995 | European Pat. Off. |
| 0 690 666 | 1/1996 | European Pat. Off. |

OTHER PUBLICATIONS

Patent Abstracts of Japan, vol. 95, No. 004, JP-A-07 106095, Apr. 21, 1995.

*Primary Examiner*—John Niebling
*Assistant Examiner*—Joni Y. Chang
*Attorney, Agent, or Firm*—Oblon, Spivak, McClelland, Maier & Neustadt, P.C.

[57] ABSTRACT

A plasma etching apparatus of the induction coupling type for processing an LCD substrate has a process container forming an airtight process room. A work table is arranged in the process room for supporting the LCD substrate. A vacuum pump is arranged for exhausting and setting the process room at a vacuum. An antenna block having a plurality of dielectric layers is arranged to face the work table. An RF antenna is embedded in one of the dielectric layers of the antenna block for forming an electric field. A power supply is connected to the RF antenna for applying an RF power. The lowermost layer of the antenna block is formed as a shower head for supplying a process gas into the process room from a position between the RF antenna and the work table. At least part of said process gas is turned into plasma by the electric field.

21 Claims, 13 Drawing Sheets

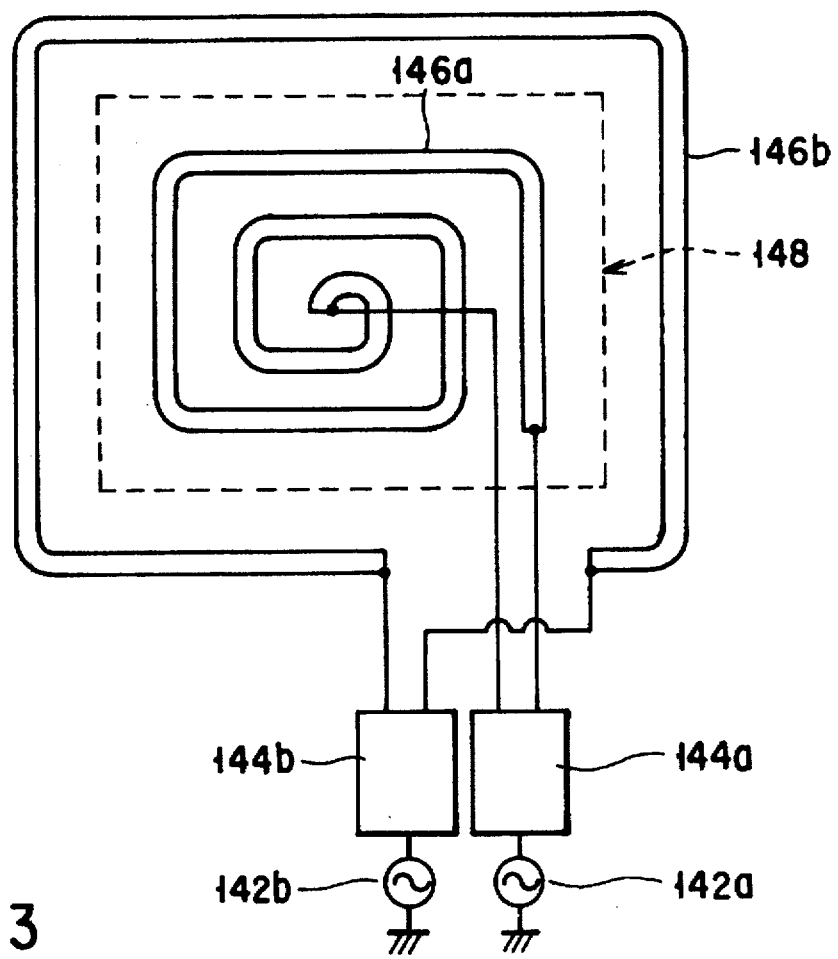
F I G. 3
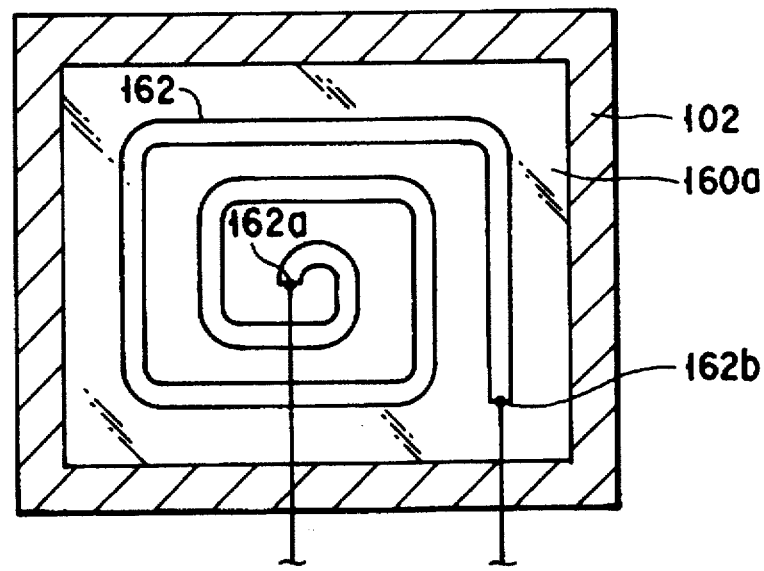
F I G. 9

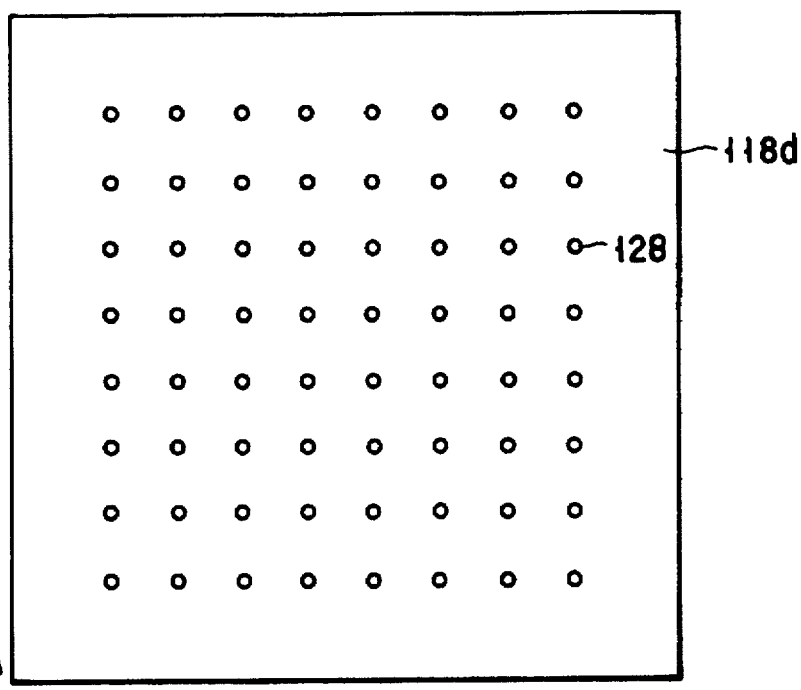
F I G. 4A
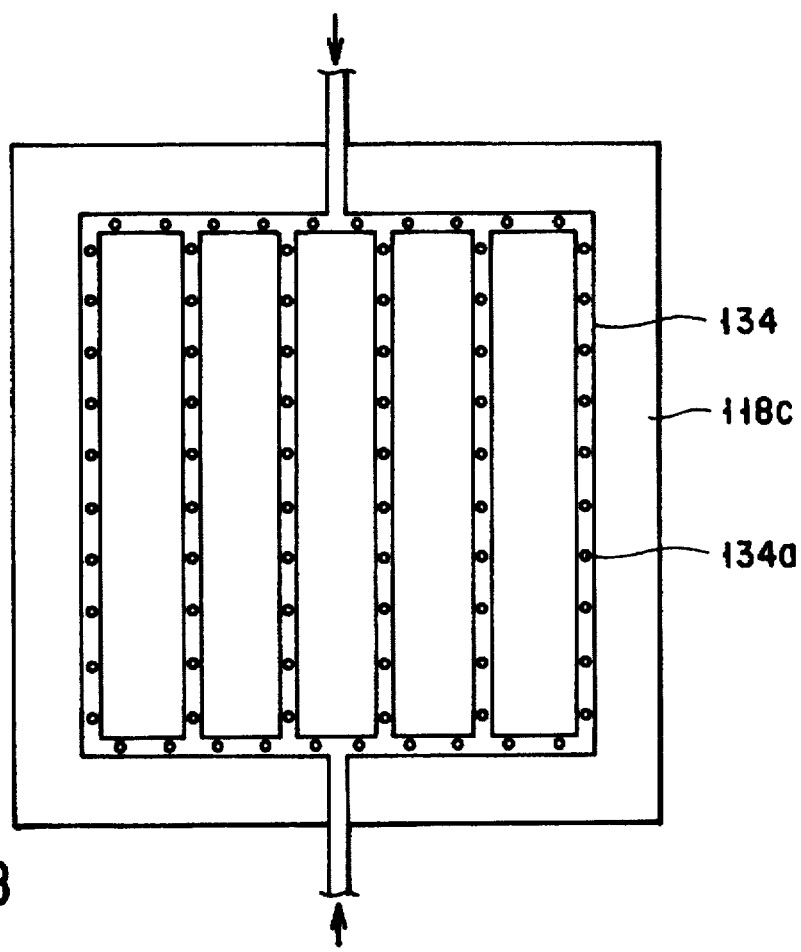
F I G. 4B

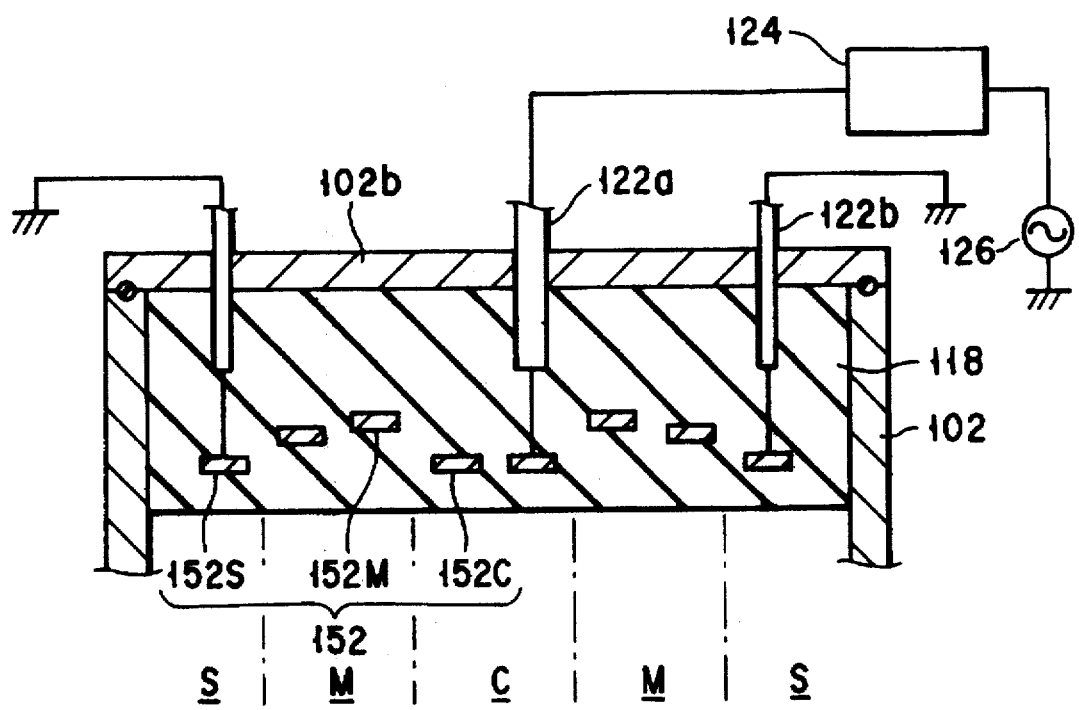
F I G. 5
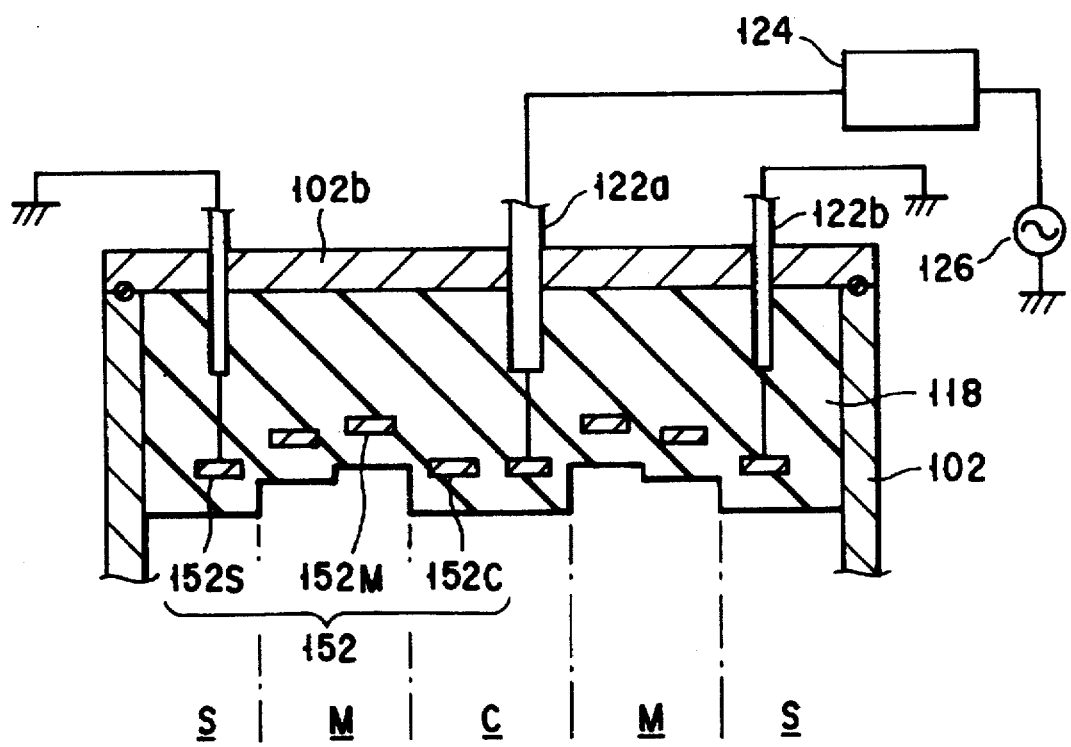
F I G. 6

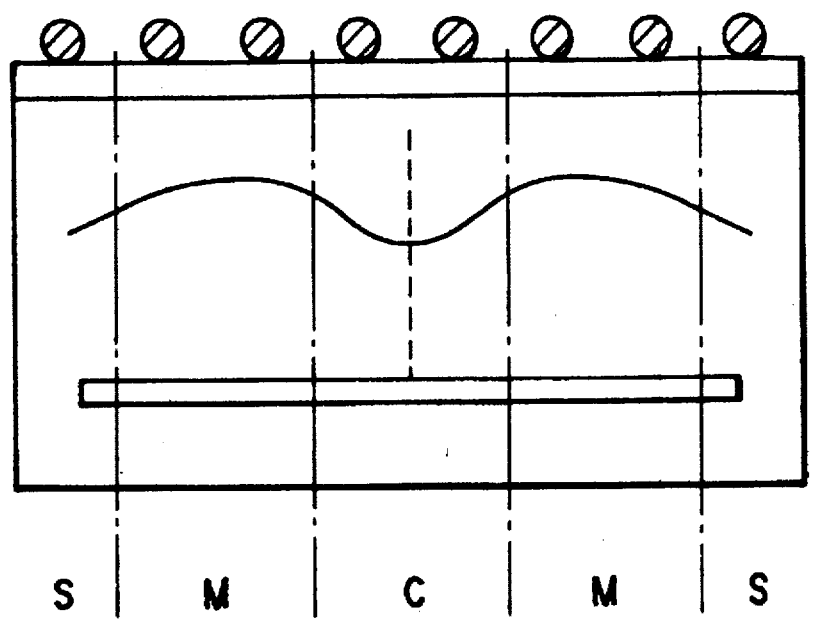
F I G. 7A
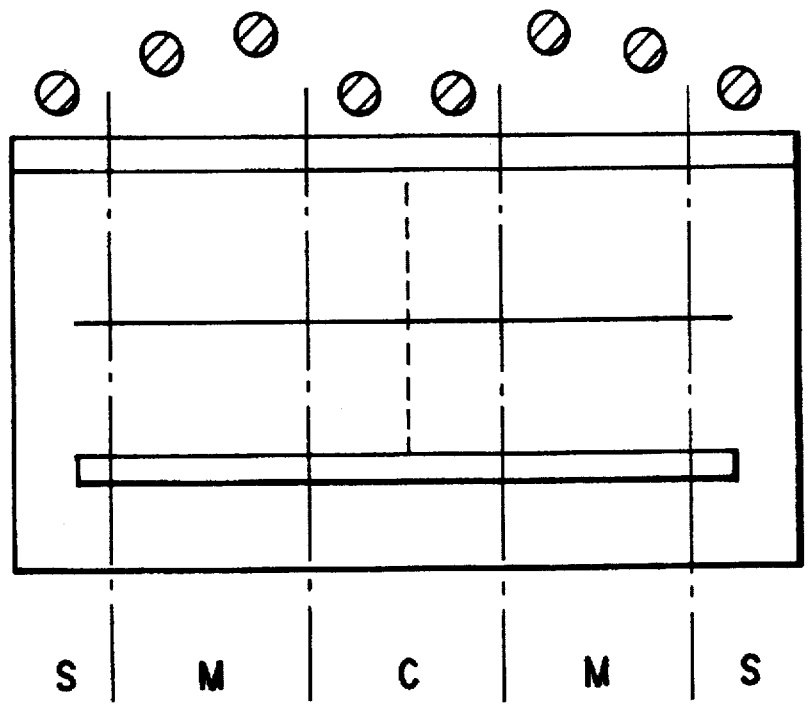
F I G. 7B

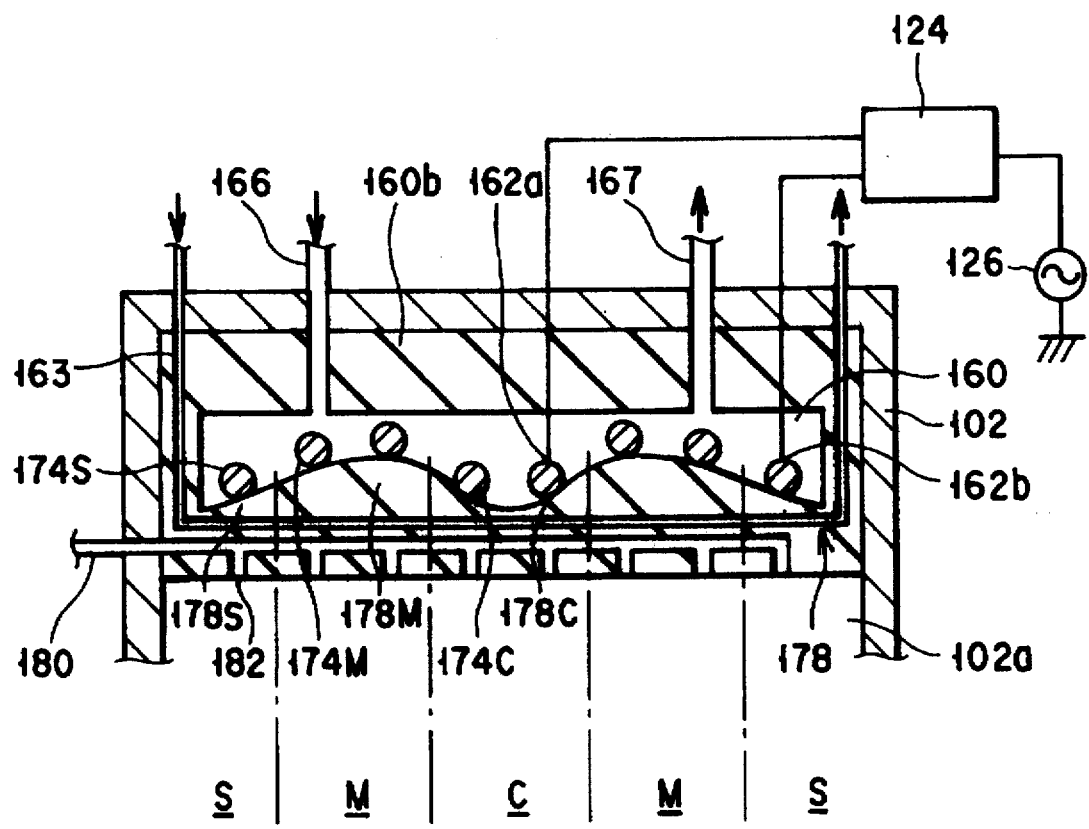
F I G. 12

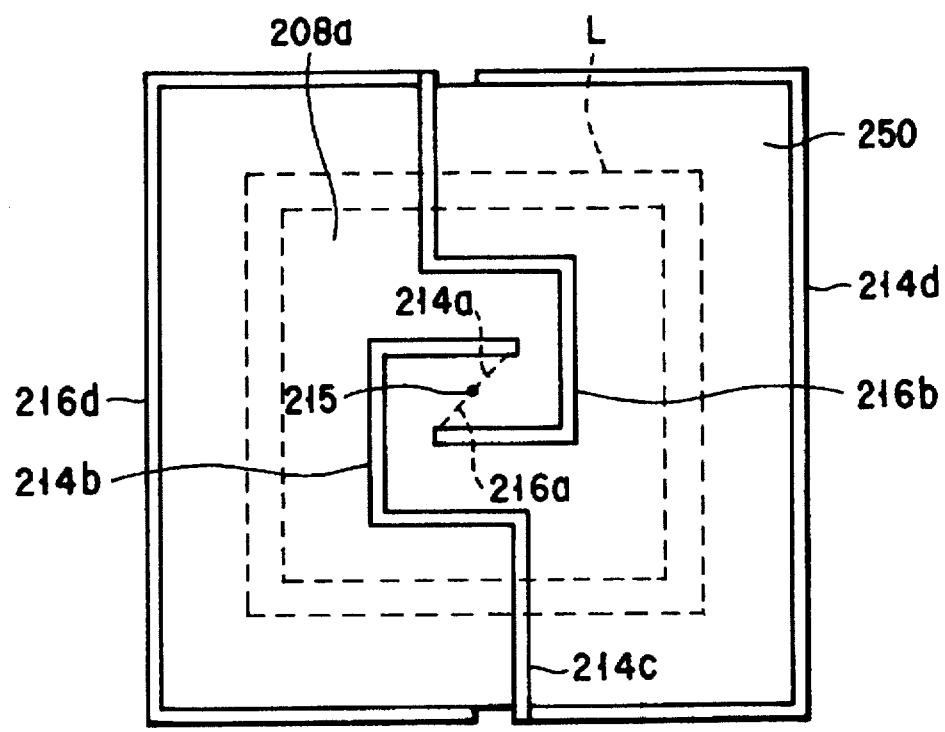
F I G. 15
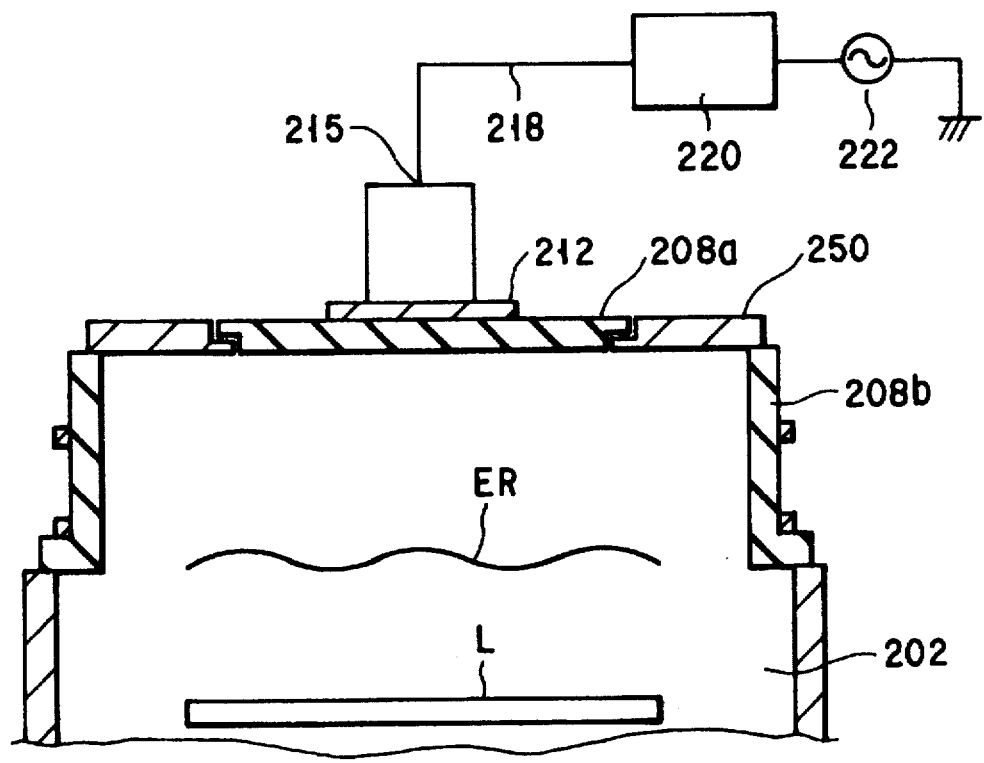
F I G. 16

PLASMA PROCESSING APPARATUS

BACKGROUND OF THE INVENTION

1. Field of the Invention

The present invention relates to a plasma processing apparatus, and particularly to a plasma processing apparatus of the induction coupling type in which induction plasma is excited in a process room by applying an RF (radio frequency) power to an RF antenna.

2. Description of the Related Art

In recent years, with an increase in the degree of integration level of a semiconductor device and an LCD (liquid crystal display), it has become necessary to perform an ultra fine process of the order of sub-micron and furthermore of sub-half-micron. In order to perform such a process in a plasma processing apparatus, it is important to control high density plasma with high accuracy under a low pressure atmosphere, such as between 1 mTorr and 50 mTorr. It is also necessary to form the plasma to have a high uniformity and a large area so as to correspond to a wafer of a large diameter or an LCD substrate of a large size.

In consideration of these technical demands, a lot of approaches have been made to establish a new plasma source. For example, EP-A-0,379,828 discloses a plasma processing apparatus of the RF induction coupling type using an RF antenna. As shown in FIG. 17, the plasma processing apparatus 10 of the RF induction coupling type is designed such that one side, e.g., the ceiling side, of a process room 16, which faces a work table 14 for supporting a target object 12, is made of a dielectric body 18, such as quartz glass. An RF antenna 20 formed of, e.g., a spiral coil, is disposed on the outside of the dielectric body 18. An electric field is formed in the process room 16 by applying an RF power to the RF antenna 20 from an RF power supply 22 through a matching circuit 24. Electrons flowing in the electric field are made to collide with neutral particles in a process gas, so that the gas is dissociated and plasma is generated.

An RF power for generating a bias is applied to the work table 14 so that a plasma flow incident on the target surface of the target object 12 is accelerated. An exhaust port 28 communicating with exhaust means (not shown) is arranged at the bottom of the process room 16, so that the inside of the process room 16 can be set to have a predetermined pressure atmosphere. A process gas supply port 30 is arranged at the center of the dielectric body 18 forming the ceiling of the process room 16 to feed a predetermined process gas into the process room 16.

In such a conventional plasma processing apparatus of the RF induction coupling type, a dielectric body, on which an RF antenna is arranged, constitutes the ceiling of a process room, which is kept at a low pressure atmosphere. For this reason, it is necessary for the dielectric body to have a large thickness so that it can withstand a pressure difference between the outside and inside of the process room. As a result, a problem arises such that coefficient of use of an applied energy from an RF power supply is decreased. This problem becomes prominent in a plasma processing apparatus having a big size for processing a wafer of a large diameter or an LCD substrate of a large surface area.

Further, in the conventional plasma processing apparatus of the RF induction coupling type, the distribution and density of plasma excited in a process room is altered, depending on the pitch of an RF antenna and the thickness of a dielectric body. However, in the conventional plasma processing apparatus of the RF induction coupling type, since the thickness of the dielectric body is limited in its adjustment, the distribution and density of plasma cannot help to be limited in their adjustment. This problem also becomes prominent in a plasma processing apparatus having a big size for processing a wafer of a large diameter or an LCD substrate of a large surface area.

Still further, where an RF antenna is arranged outside a process room, a problem is caused such that an electromagnetic wave generated by the RF antenna is leaked to the atmosphere.

SUMMARY OF THE INVENTION

The present invention has been made in consideration of the above described problems caused in a conventional plasma processing apparatus of the RF induction coupling type. Therefore, it is an object of the present invention to provide a novel and improved plasma processing apparatus of the RF induction coupling type, which can increase the coefficient of use of an applied energy from an RF power supply, and generate uniform plasma of a high density even under a low pressure condition.

According to a first aspect of the present invention, there is provided a plasma processing apparatus for processing a target substrate, using a plasma, comprising:

a container forming an airtight process room;

a work table arranged in the process room for supporting the target substrate;

a main exhaust for exhausting and setting the process room at a vacuum;

an antenna block arranged in the process room and having a first layer of dielectric which faces the work table;

an RF antenna embedded in the first layer of dielectric for generating an electric field in the process room;

a power supply section for applying an RF power to the RF antenna; and a main supply for supplying a process gas into the process room from a position between the antenna and the work table, at least part of the process gas being turned into the plasma by the electric field.

According to a second aspect of the present invention, there is provided a plasma processing apparatus for processing a target substrate, using a plasma, comprising:

a container forming an airtight process room;

a work table arranged in the process room for supporting the target substrate;

a main exhaust for exhausting and setting the process room at a vacuum;

a container of dielectric arranged in the process room and forming an airtight antenna room which faces the work table;

an RF antenna arranged in the antenna room for generating an electric field in the process room;

a power supply section for applying an RF power to the RF antenna;

a main supply for supplying a process gas into the process room from a position between the antenna and the work table, at least part of the process gas being turned into the plasma by the electric field; and an auxiliary exhaust for exhausting and setting the antenna room at a vacuum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a plan view showing a modification of the RF antenna;

FIGS. 4A and 4B are plan views showing a process gas supply layer of the etching apparatus shown in FIG. 1, and a modification of the process gas supply layer, respectively;

FIG. 5 is a cross sectional view showing the main part of a modification of the etching apparatus shown in FIG. 1;

FIG. 6 is a cross sectional view showing the main part of another modification of the etching apparatus shown in FIG. 1;

FIGS. 7A and 7B are explanatory views showing relationships between the arrangement of the RF antenna and etching rate;

FIG. 9 is a plan view schematically showing an RF antenna of the etching apparatus shown in FIG. 8;

FIG. 12 is a cross sectional view showing the main part of still another modification of the etching apparatus shown in FIG. 8;

FIG. 15 is a plan view schematically showing a modification of the etching apparatus shown in FIG. 13;

FIG. 16 is a cross sectional view schematically showing an operation of the etching apparatus shown in FIG. 13.

DETAILED DESCRIPTION OF THE PREFERRED EMBODIMENTS

Figure 1:
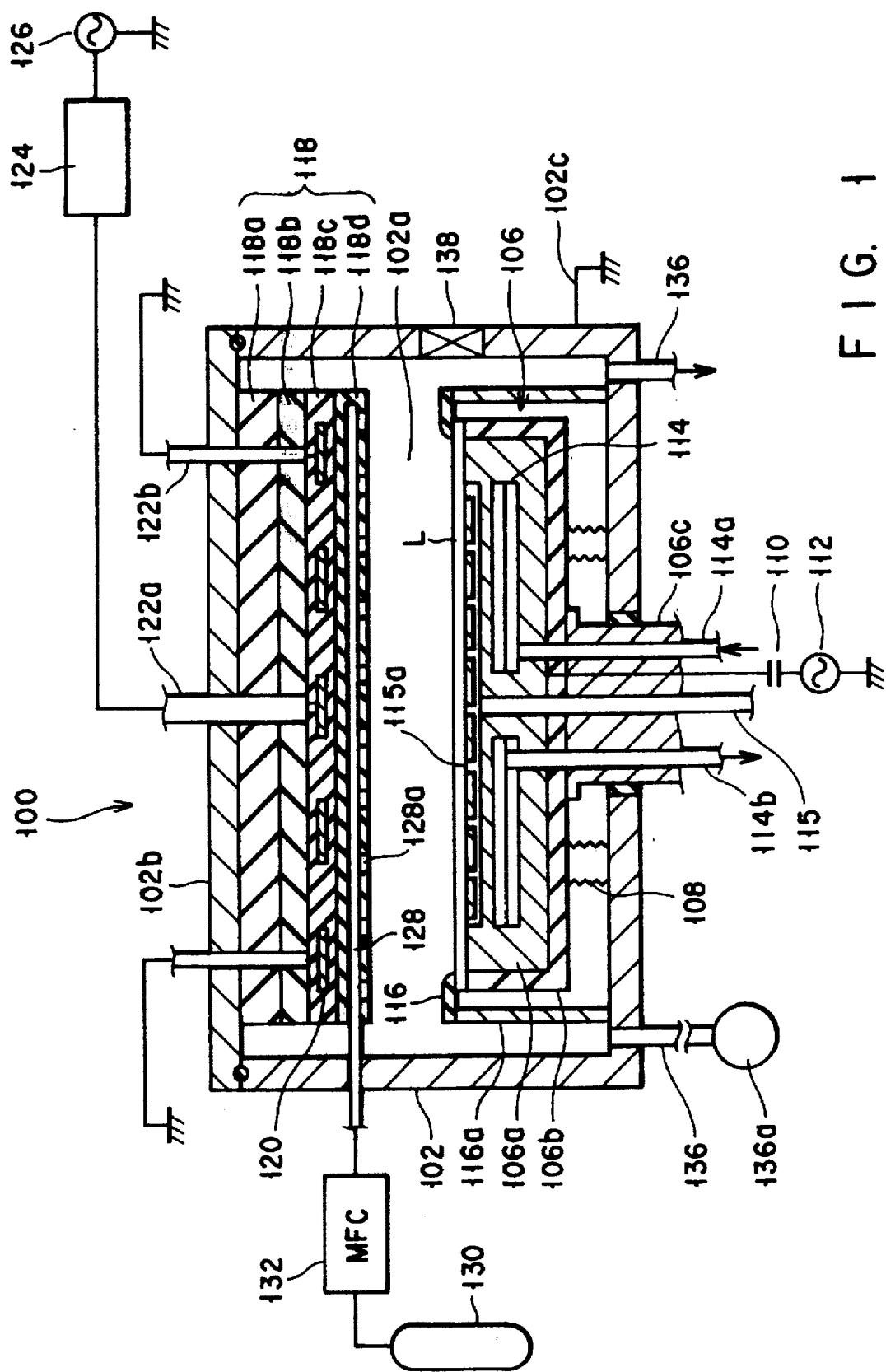
FIG. 1 is a cross sectional view showing an etching apparatus of an LCD substrate, which is an application of a plasma processing apparatus according to an embodiment of the present invention.

FIG. 1 is a cross sectional view showing an etching apparatus of an LCD substrate, which is an application of a plasma processing apparatus according to an embodiment of the present invention.

The plasma etching apparatus 100 shown in FIG. 1 has a process container 102 which is made of a conductive material, such as aluminum having an oxidized alumite surface or stainless steel, and has a cylindrical or rectangular box shape. A predetermined etching process is performed in a process room 102a formed in the process container 102.

The process container 102 is grounded through a line 102c. A work table 106 having an essentially rectangular shape is arranged on the bottom in the process container 102 for mounting a target object, such as an LCD substrate L. The work table 106 is constituted by an electrode portion 106a made of a conductive material, such as aluminum having an oxidized alumite surface or stainless steel, and an electrode protecting portion 106b made of an insulating material, such as ceramics, and surrounding the electrode portion 106a except the mount surface. The work table 106 is attached to the top of an elevating shaft 106c penetrating the bottom of the process container 102. The elevating shaft 106c is movable in a vertical direction by the driving force of an elevating mechanism (not shown), so that the entirety of the work table 106 can be moved up and down, when necessary. An expandable bellows 108 is arranged around the elevating shaft for securing the airtightness inside the process room 102a.

An RF power supply 112 is electrically connected to the electrode portion 106a of the work table 106 through a matching circuit 110. During a plasma process, a predetermined RF power of, e.g., 2 MHz is applied to the electrode portion 106a to generate a bias potential, so that plasma exited in the process room 102a is effectively attracted to the target surface of the substrate L. Although the apparatus shown in FIG. 1 is constituted such that an RF power is applied to the work table 106, the apparatus may be constituted such that the work table 106 is simply grounded.

A cooling jacket 114 is arranged in the electrode portion 106a of the work table 106. A coolant, such as ethyleneglycol, whose temperature is adjusted by a chiller, is fed into the cooling jacket 114 through a coolant supply pipe 114a. The ethyleneglycol thus supplied generates cold while circulating in the cooling jacket 114. With this arrangement, cold from the ethyleneglycol is transmitted to the substrate L from the cooling jacket 114 through the work table 106, so that the target surface of the substrate L is thermally controlled to have a preferable temperature. The circulated ethyleneglycol is exhausted to the outside of the process container 102 through a coolant exhaust pipe 114b. Heating means, such as a heater, may be arranged in the work table 106, though it is not shown in FIG. 1, for thermally controlling the target surface of the substrate L.

A plurality of holes 115a are formed in the mount surface of the work table 106. A certain heat transmission gas, such as helium, is fed to a space between the mount surface of the work table 106 and the backside of the substrate L through a gas supply pipe 115 and the holes 115a, so that heat transmission coefficient is increased. By doing so, the substrate can be thermally controlled in an efficient manner even under a low pressure atmosphere.

A clamp frame 116 is arranged above the work table 106 for clamping the periphery of the substrate L. The clamp frame 116 is supported by, e.g., four support pillars 116a standing around the work table 106. When the work table 106 supporting the substrate L is moved up and the periphery of the substrate L is brought into contact with the clamp frame 116, the substrate L is mounted and fixed on the work table 106. Pusher pins (not shown) are also arranged in the work table 106, so that the substrate L is transferred onto the work table 106 or lifted up from the work table 106, by movement of the pusher pins in vertical directions.

An antenna block 118, in which an RF antenna 120 is embedded, is arranged in contact with that ceiling plate 102b of the process container 102, which substantially faces the mount surface of the work table 106 for the substrate L. The antenna block 118 has a multi-layer structure having, e.g., four layers each consisting essentially of a dielectric material, as shown in FIG. 1. To be exact, the antenna block 118 is formed of a Pyrex glass layer 118a, a quartz layer 118b, an antenna embedding layer 118c containing the RF antenna 120 embedded in compacted powder of a dielectric material, such as mica, and a process gas supply layer 118d made of quartz in which a process gas passage is formed.

The materials of the four layers should be selected such that they have similar coefficients of thermal expansion, so that the layers are prevented from separating from each other due to heat generated by the RF antenna 120 when an RF power is applied to the antenna 120. Although mica and Pyrex glass are used in consideration of workability and cost, all the four layers may be made of quartz. The number of the stacked dielectric layers is not limited to four, but may be more. In contrast, the antenna block 118 may not have a multi-layer structure, but may be formed of a single dielectric layer in which an RF antenna is embedded.

The ceiling plate 102b of the process container 102 is detachable along with antenna block 118 and the RF antenna 120. With this arrangement, maintenance of the antenna block 118 and the RF antenna 120 can be easily performed.

Figure 2:
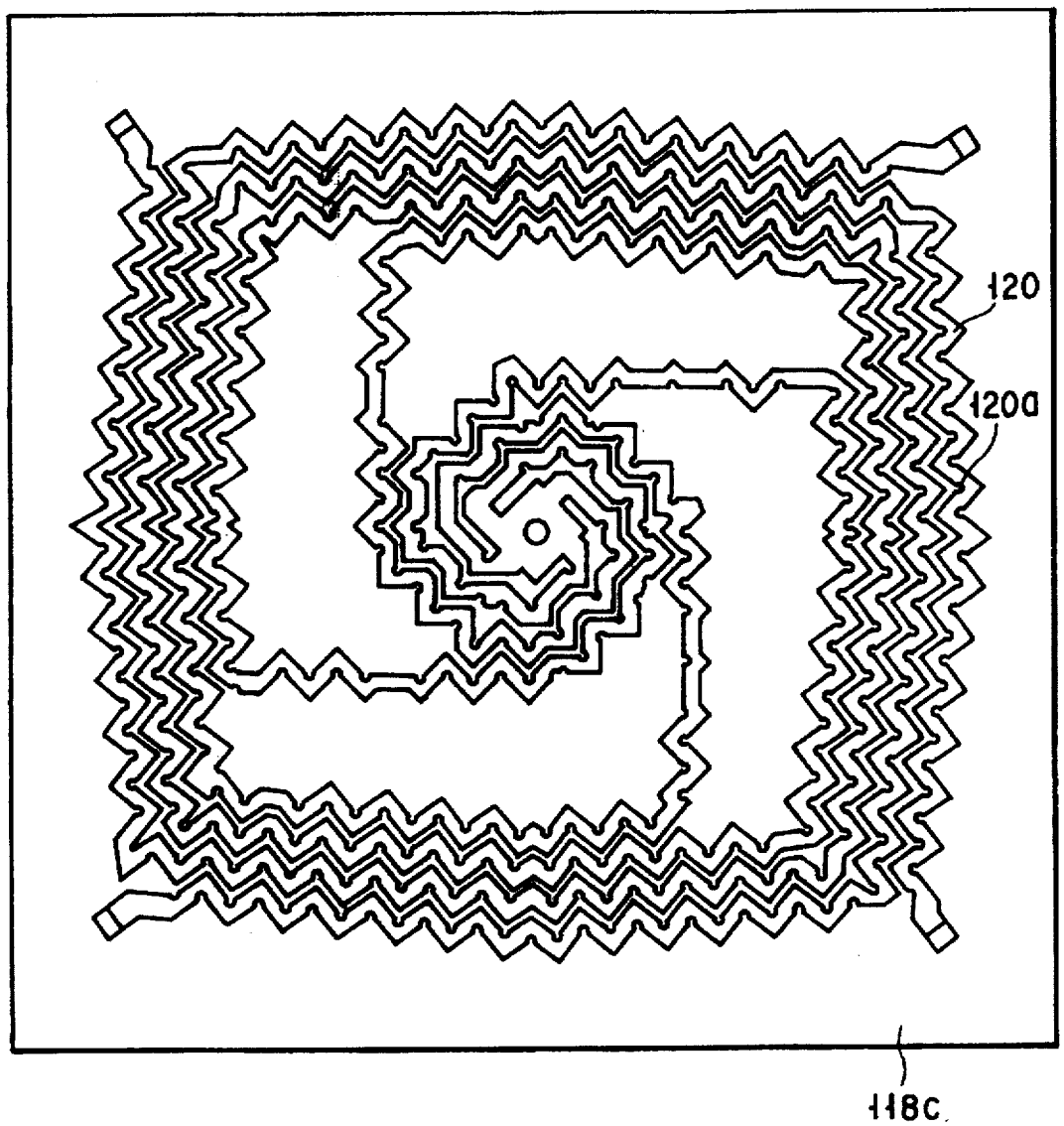
FIG. 2 is a plan view schematically showing an RF antenna embedded in a dielectric layer of the etching apparatus shown in FIG. 1.

As shown in FIG. 2, the antenna embedding layer 118c has a structure in which the RF antenna 120, formed of a conductive strip, such as a copper, aluminum, or stainless steel plate, is embedded in a dielectric layer formed of, e.g., compacted mica powder. Since the RF antenna 120 is embedded in the dielectric material powder, the antenna embedding layer 118c can absorb thermal expansion of the RF antenna 120, so that separation and the like are prevented from occurring.

Where the RF antenna 120 is embedded in a common solid dielectric body, such as a quartz layer, since the coefficient of thermal expansion of the dielectric layer and that of the RF antenna 120 differ from each other, it is possible for them to cause separation therebetween due to distortion generated by thermal expansion of the RF antenna 120 when an RF power is applied to the RF antenna 120 and the antenna 120 and part therearound are heated. In this case, therefore, it is preferable to form notches 120a in many places of the RF antenna 120 so that thermal expansion of the RF antenna 120 is absorbed by the notches 120a, as shown in FIG. 2.

According to this embodiment, the notches 120a are formed in the RF antenna 120 while the dielectric material powder is used. As a result, thermal expansion of the RF antenna 120 is absorbed by means of a synergistic effect to suppress distortion, so that an undesirable phenomenon, such as separation, can be prevented from occurring.

Although the RF antenna 120 is formed of a spiral coil of several turns in FIG. 2, the RF antenna 120 can be modified as long as it has an antenna function for generating plasma, and may be formed of a coil with few turns when the frequency of an RF power is high.

Back to FIG. 1 again, an electric supply passage 122a and a ground line passage 122b are arranged to penetrate the Pyrex glass layer 118a and the quartz layer 118b and to reach the RF antenna 120 in the mica layer 118c. An RF power supply 126 is connected to the electric supply passage 122a through a matching circuit 124. During a plasma process, an RF power of a predetermined frequency, such as 13.56 MHz, is applied to the RF antenna 120 from the RF power supply 126, so that induction plasma is excited in the process room 102a. The electric body interposed between the RF antenna 120 and the ceiling plate 102b of the grounded process container 102 works for preventing the capacity component of the RF antenna 120 from being increased by an influence of the ground.

The process gas supply layer 118d is constituted such that the gas passage 128 is formed in a dielectric body of, e.g., quartz. As shown in FIG. 4A, a number of holes 128a communicating with the gas passage 128 are formed in the surface of the process gas supply layer 118d on the work table 106 side, so that a shower head is constituted. A predetermined process gas, such as $CF_4$ gas for etching $SiO_2$, or $BCl_3+Cl_2$ gas for etching Al, is fed into the gas passage 128 from a process gas source 130 through a flow controller (MFC) 132, and then is spouted out from the holes 128a like a shower into the process room 102a. As a result, uniformity of a process gag density in the process room 102a is increased, so that plasma having a uniform density is excited in the process room 102a.

Although the process gas supply layer 118d is part of the multi-layer structure in FIG. 4A, a process gas supply pipe structure 134 made of a dielectric material such as quarts may be used instead, and arranged on the antenna embedding layer 118c on the work table 106 side. In this case, a number of holes 134a are formed in the process gas supply pipe structure 134 on the work table 106 side, so that a process gas is spouted out from the holes 134a into the process room 102a.

A cooling water passage may be formed in the antenna block 118 for circulating cooling water. With this arrangement, the RF antenna 120 heated by application of an RF power is cooled, so that the lives of the RF antenna 120 and the antenna block 118 are made long.

The antenna block 118 and the RF antenna 120 of the etching apparatus 100 according this embodiment are integrally arranged in the process container 102. As a result, the thickness of a dielectric body arranged between the RF antenna 120 and the target object can be set small, even though there is a substantial pressure difference between the atmosphere and the inside of the process room. It follows that an electric field formed in the process room 102a can become strong, with an RF power applied to the RF antenna 120 from the RF power supply 126. Further, since the thickness of the dielectric body is freely adjustable, it is possible to control induction plasma excited in the process room over its distribution and density with high accuracy.

An exhaust pipe 136 communicating with exhausting means, such as vacuum pump 136a, is connected to the bottom of the process container 102. The inside atmosphere of the process room 102a can be set at an arbitrary pressure by exhausting the process room 102a by the exhausting means.

A gate valve 138 is arranged at one side of the process container 102. A new substrate L is loaded into the process room 102a from an adjacent load lock chamber (not shown) through the gate valve 138 by transfer means, such as a transfer arm (not shown), and a processed substrate L is unloaded from the process room 102a through the gate valve 138.

An explanation will be given in terms of an operation of the plasma etching apparatus shown in FIG. 1.

At first, an LCD substrate L is loaded into the process room 102a by the transfer arm (not shown) through the gate valve 138. At this time, the work table 106 is positioned at its lower position while the pusher pins (not shown) are at their upper positions. The transfer arm is retreated to the outside of the process container 102 through the gate valve 138 after handing the substrate L onto the pusher pins. Then, the pusher pins are moved down, so that the substrate L is mounted on the mount surface of the work table 106. Then, the work table 106 is moved up by the elevating mechanism to bring the periphery of the substrate L into contact with the bottom surface of the clamp frame 116, so that the substrate L is fixed on the work table 106.

The process room 102a is vacuum-exhausted by the vacuum pump 136a connected to the exhaust pipe 136. On the other hand, a predetermined process gas, such as $CF_4$ gas for etching $SiO_2$, or $BCl_3+Cl_2$ gas for etching Al, is fed into the process room 102a through the gas supply holes 128a of the process gas supply layer 118d. By doing so, the inside of the process room 102a is kept at a low pressure, such as about 30 mTorr.

An RF power of, e.g., 13.56 MHz from the RF power supply 126 through the matching circuit 124 is applied to the RF antenna 120 embedded in the antenna embedding layer 118c of the antenna block 118. An electric field is formed in the process room 102a by means of induction caused by an inductance component of the RF antenna 120. Since the RF antenna 120 is embedded in the antenna embedding layer 118c of the antenna block 118, which is arranged in contact with the ceiling 102b of the process container 102, the thickness of a dielectric body on the side facing the target object can be thinner than that of a conventional apparatus. As a result, an electric field formed in the process room 102a can be stronger than that of the conventional apparatus, so that plasma having a higher density can be generated in the process room 102a.

The plasma thus excited in the process room 102a is moved toward the substrate L mounted on the work table 106 by a bias potential applied to the work table 106. The target surface of the substrate L is subjected to a predetermined etching process with the plasma. After the etching process is completed, the processed LCD substrate L is unloaded to the load lock chamber by the transfer arm through the gate valve 138, thereby finishing all the operation in order.

In the apparatus shown in FIG. 1, since the antenna block 118, in which the spiral RF antenna 120 is embedded, has the shape of a flat plate, a formed electric field has a stronger intensity at its intermediate portion where the RF antenna 120 has a higher density. As a result, plasma has a higher density at an intermediate region of the process room, and thus, as shown in FIG. 7A, etching rates (ER) may lack uniformity among the intermediate region (M), a central region (C), and a peripheral region (s).

Note that, here in the specification, the central region (C) is defined by a region in the process room corresponding to the orthogonal projection of the central region on the target surface of an object to be processed, the intermediate region (M) is defined by a region in the process room corresponding to the orthogonal projection of the intermediate region surrounding the central region on the target surface, and the peripheral region (S) is defined by a region in the process room corresponding to the orthogonal projection of the peripheral region, i.e., outermost region surrounding the intermediate region on the target surface. However, the concept of the central, intermediate, and peripheral regions (C), (M), and (S) is a matter of relativity, and thus is decided on the basis of relativity, in relation to the size and mounted position of the target object, and the size and arrangement of the process room.

In order to allow plasma, which may have different densities among the central, intermediate, and peripheral regions (C), (M), and (S), to have a uniform density, the apparatus shown in FIG. 1 can be modified as described below with reference to FIGS. 3, 5 and 6. In these modifications, the corresponding parts to those of the apparatus shown in FIG. 1 are provided with the same reference numbers, and their detailed explanation is omitted.

In the apparatus shown in FIG. 1, the RF antenna 120 is supplied with an RF power from the RF power supply of a single system, as shown in FIG. 2, and thus generated plasma may have different densities among the central, intermediate, and peripheral regions (C), (M), and (S), as shown in FIG. 7A. For this reason, as shown in FIG. 3, RF power supplies 142a and 142b of two systems may be employed such that different RF powers therefrom are respectively applied to RF antennas 146a and 146b of the two systems through matching circuits 144a and 144b. With the RF antennas of plural systems, as shown in FIG. 3, it is possible to arrange the RF antennas to have a higher density and/or to apply a higher RF power at a place where plasma is apt to have a lower density, and on the other hand, to arrange the RF antennas to have a lower density and/or to apply a lower RF power at a place where plasma is apt to have a higher density, so that plasma generated in the process room has a uniform density.

An electric field shield 148 is arranged to surround the first RF antenna 146a for preventing the first and second RF antennas 146a and 146b from interfering with each other. With this arrangement, it is possible to apply a stronger power to the peripheral region of the process room where plasma is apt to have a low density.

In a modification shown in FIG. 5, a distance between an intermediate portion 152M of an RF antenna 152 embedded in an antenna block 118 of dielectric and a substrate L mounted on a work table 106 is set larger than distances between an central portion 152C positioned near a terminal 122a and the substrate L, and a peripheral portion 152S positioned near a terminal 122b and the substrate L. The bottom surface of the antenna block 118 is flat and substantially parallel to the substrate L. In other words, the thickness of a dielectric body under the intermediate portion 152M is larger than those of dielectric bodies under the central and peripheral portions 152C and 152S. With this arrangement, it is possible to decrease a transmitted RF energy in the intermediate region (M) where plasma is apt to have a higher density. As a result, plasma generated in the process room has a uniform density, and planar uniformity of etching rate (ER) is increased.

In a modification shown in FIG. 6, the bottom surface of an antenna block 118 of dielectric is formed to have steps in accordance with positions of an RF antenna 152. In this case, the thickness of a dielectric body interposed between the RF antenna 152 and a substrate L is uniform.

In the apparatus shown in FIG. 1, the RF antenna 120 has a spiral shape. Other than a spiral shape antenna, an RF antenna having one loop or more, or having a coil shape may be employed. The number of turns and the pitch of an RF antenna can be selected to be optimum in accordance with the size of a processing apparatus and the type of a process.

In the apparatus shown in FIG. 1, an RF power is applied to the RF antenna 120 from the single RF power supply 126.

However, as has been described with reference to FIG. 3, the RF antenna may be formed of a plurality of RF antenna members such that a spiral antenna member is arranged at the center and a loop antenna member is arranged to surround the spiral antenna member. In this case, the antenna members can be respectively supplied with RF powers from a plurality of RF power supplies which are independently controllable. With this arrangement, plasma densities at, e.g., the central region and regions therearound can be respectively controlled independently of each other, so that the densities become uniform. Where the RF antenna is formed of a plurality of RF antenna members, a shield should be arranged for preventing the RF antenna members from interfering with each other.

In relation to an RF power applied to the RF antenna 120, it is possible to perform several kinds of controls, such as a phase control, a frequency modulation control, and a pulse control, so as to allow plasma excited in the process room to be optimum. In relation to a bias potential applied to the work table 106, it is possible to perform several kinds of controls, such as a phase control, a frequency modulation control, and a pulse control, so as to allow the timing of attracting plasma to be optimum.

With a plasma processing apparatus according to the embodiment, which has been described with reference to FIGS. 1 to 7 exemplifying the etching apparatus, excellent advantages are obtained as follows:

Since a dielectric body, in which an RF antenna is embedded, is arranged in a process container to be in contact with the process container, the thickness of the dielectric body can be made thin, even if there is a large pressure difference between the atmosphere and the inside of a process room. As a result, an RF energy applied to the RF antenna is effectively used. Further, since the thickness of the dielectric body is freely adjustable, the distribution and density of an induction plasma excited in the process room can be controlled with high accuracy.

A process gas is uniformly supplied into the process room through a plurality of gas spouting holes formed in that surface of the dielectric body of the plasma processing apparatus which faces a target object. As a result, even where a wafer of a large diameter or an LCD substrate of a large surface area is to be processed, the process can be performed, with plasma having a uniform density, excited in the process room, so that planar uniformity of the process is increased.

Since an antenna block of the plasma processing apparatus is formed of a plurality of stacked dielectric members, a structure, in which the RF antenna and a process gas supply passage are arranged, can be relatively easily manufactured. The antenna block formed of the multi-layer structure is strong, and its parts can be easily exchanged.

A plurality of notches are formed in the RF antenna embedded in the dielectric body of the plasma processing apparatus, for absorbing thermal expansion of the RF antenna. When an RF power is applied to the RF antenna, the RF antenna is heated and expanded. However, the notches absorb the expansion of the RF antenna. As a result, although the dielectric body and the RF antenna embedded therein have different coefficients of thermal expansion, no damage, such as separation, can be easily caused.

Figure 8:
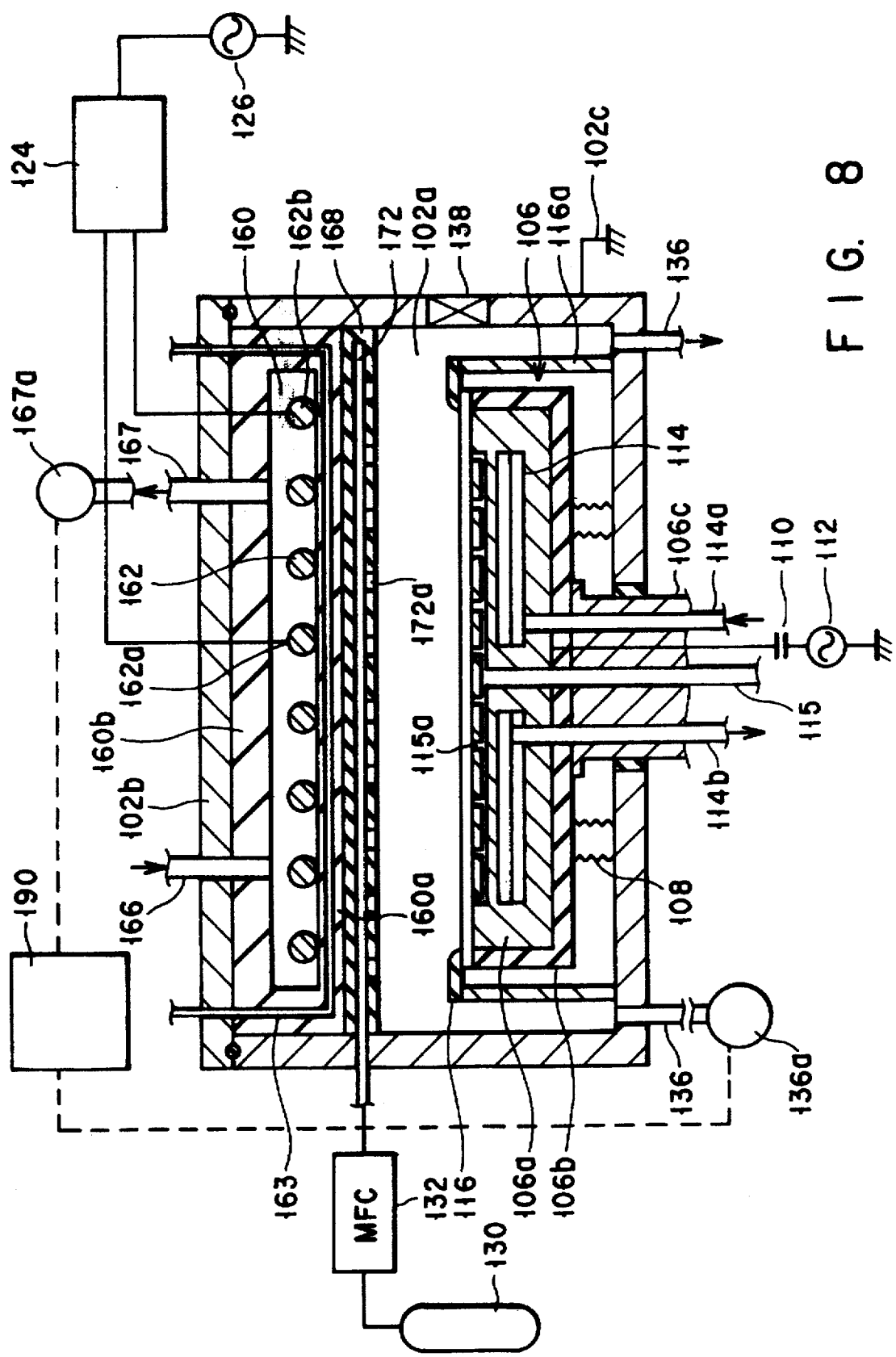
FIG. 8 is a cross sectional view showing an etching apparatus of an LCD substrate, which is an application of a plasma processing apparatus according to another embodiment of the present invention.

FIG. 8 is a cross sectional view showing an etching apparatus of an LCD substrate, which is an application of a plasma processing apparatus according to another embodiment of the present invention. In FIG. 8, the corresponding parts to those of the apparatus shown in FIG. 1 are provided with the same reference numbers, and their detailed explanation is given, when necessary.

An antenna room 160 is arranged to be in contact with that ceiling plate 102b of a process container 102, which substantially faces the mount surface of a work table 106 for an LCD substrate L. The antenna room 160 is defined by an airtight container made of a dielectric material, such as quartz glass or ceramics. As shown in FIG. 9, an RF antenna 162, which is made of a conductive material, such as copper, aluminum, or stainless steel, and has the shape of spiral, coil, or loop, is arranged in the antenna room 160. Although the RF antenna 162 is formed of a spiral coil of two turns in FIG. 9, the RF antenna 162 can be modified as long as it has an antenna function for generating plasma, and may be formed of a one-turn coil when the frequency of an RF power is high. An RF power supply 126 for generating plasma is connected through an matching circuit 124 between the two terminals of the RF antenna 162, i.e., terminals 162a and 162b.

The antenna room 160 is constituted such that the thickness of a wall 160a facing the substrate L is smaller than that of a wall 160b which is in contact with the ceiling plate 102b of the process container 102. With this arrangement, an electric field, generated by an RF energy applied to the RF antenna 162 from the RF power supply 126, can be concentrated on the substrate L side. As a result, plasma having a density higher than that of a conventional apparatus can be generated in the process room 102a.

A gas supply pipe 166 is connected to the antenna room 160, so that an antenna room gas, such as an inactive gas, can be fed into the process room 160 for cooling and pressure-adjusting. An exhaust pipe 167 communicating with a vacuum pump 167a is also connected to the antenna room 160. Since the RF antenna 162, which is overheated due to application of an RF energy from the RF power supply 126, is cooled down by the antenna room gas, such as an inactive gas, it is possible to prolong the life of the RF antenna 162.

As shown in FIG. 8, a coolant passage 163 is formed in the wall of the antenna room 160, for allowing a coolant, such as cooling water, to flow. Since the antenna room 162 is prevented, by cooling water flowing through the coolant passage 163, from being overheated, the life of the RF antenna 162 can be increased.

With the above described arrangement, the inside of the antenna room 160 can be set at a pressure lower than the atmospheric pressure, and preferably more than 100 Torr, by controlling the flow rate of a gas fed into the antenna room 160 from the gas supply pipe 166 and/or the exhaust rate through the exhaust pipe 167. In contrast, according to a conventional apparatus, since an RF antenna is placed in the atmosphere, it is necessary for an dielectric body separating the atmosphere and a process room to be thick so as to withstand a pressure difference between the atmosphere and the inside pressure of the process room, such as several tens mTorr.

In other words, according to the apparatus shown in FIG. 8, since the inside of the antenna room 160 is set at a pressure lower than the atmospheric pressure, a pressure difference between the antenna room 160, in which the RF antenna 162 is arranged, and the process room 102a becomes small. As a result, the wall 160a arranged between the antenna room 160 and the process room 102a can be thin. It follows that, an electric field, generated by an RF energy applied to the RF antenna 162 from the RF power supply 126, can be concentrated in the process room 102a more than a conventional apparatus, so that plasma having a higher density can be generated.

A vacuum pump 136a connected to the bottom of the process room 102a and the vacuum pump 167a of the antenna room 160 may be connected to a pressure controller 190, if necessary, as shown in FIG. 8. With this arrangement, the exhaust rate of the vacuum pump 167a can be controlled by the controller 190 so as to allow the pressure difference between the process room 102a and the antenna room 160 to fall within a predetermined range.

A process gas supply member 168 is arranged on the bottom of the antenna room 160. The process gas supply member 168 is constituted such that a gas passage 172 is formed in a dielectric body of, e.g., quartz. A number of holes 172a communicating with the gas passage 172 are formed in the surface of the process gas supply member 168 on the work table 106 side, in a manner the same as that of the holes 128a shown in FIG. 4A, so that a shower head is constituted. A predetermined process gas, such as $CF_4$ gas for etching $SiO_2$, or $BCl_3+Cl_2$ gas for etching Al, is fed to the gas passage 172 from a process gas source 130 through a flow controller (MFC) 132, and then is spouted out from the holes 172a like a shower into the process room 102a. As a result, uniformity of a process gas density in the process room 102a is increased, so that plasma having a uniform density is excited in the process room 102a.

An explanation will be given in terms of an operation of the plasma etching apparatus shown in FIG. 8.

At first, an LCD substrate L is fixed on the work table 106, in a manner as described with reference to the apparatus shown in FIG. 1. Then, the process room 102a is vacuum-exhausted by the vacuum pump 136a connected to the exhaust pipe 136. On the other hand, a predetermined process gas, such as $CF_4$ gas for etching $SiO_2$, or $BCl_3+Cl_2$ gas for etching Al, is fed into the process room 102a through the gas supply holes 172a of the process gas supply member 168. By doing so, the inside of the process room 102a is kept at a low pressure, such as about 30 mTorr. At this time, an antenna room gas, such as an inactive gas, is fed into the antenna room 160 through the gas supply pipe 166, so that the inside of the antenna room 160 is kept at a pressure, such as 100 Torr, lower than the atmospheric pressure.

An RF power of, e.g., 13.56 MHz from the RF power supply 126 through the matching circuit 124 is applied to the RF antenna 162 arranged in the antenna room 162. An electric field is formed in the process room 102a by means of induction caused by an inductance component of the RF antenna 162. The antenna room 162 is arranged in contact with the ceiling 102b of the process container 102, and the dielectric wall 160a facing the target object can be thinner than that of a conventional apparatus. As a result, an electric field formed in the process room 102a can be stronger than that of the conventional apparatus, so that plasma having a higher density can be generated in the process room 102a.

The target surface of the substrate L is subjected to a predetermined etching process with the plasma thus excited in the process room 102a. After the etching process is completed, the processed LCD substrate L is unloaded to the load lock chamber, in a manner as described with reference to the apparatus shown in FIG. 1, thereby finishing all the operation in order.

In the apparatus shown in FIG. 8, since the wall 160a of the antenna room 160, on which the spiral RF antenna 162 is arranged, has the shape of a flat plate, a formed electric field has a stronger intensity at its intermediate portion where the RF antenna 162 has a higher density. As a result, plasma has a higher density at an intermediate region of the process room, and thus, as shown in FIG. 7A, etching rates (ER) may lack uniformity among the intermediate region (M), a central region (C), and a peripheral region (s).

In order to allow plasma, which may have different densities among the central, intermediate, and peripheral regions (C), (M), and (S), to have a uniform density, the apparatus shown in FIG. 8 can be modified as described below with reference to FIGS. 3, and 11 to 13. In these modifications, the corresponding parts to those of the apparatus shown in FIG. 8 are provided with the same reference numbers, and their detailed explanation is omitted.

In the apparatus shown in FIG. 8, the RF antenna 162 is supplied with an RF power from the RF power supply of a single system, as shown in FIG. 9, and thus generated plasma may have different densities among the central, intermediate, and peripheral regions (C), (M), and (S), as shown in FIG. 7A. For this reason, as shown in FIG. 3, RF power supplies 142a and 142b of two systems may be employed, in a manner as described with reference to the apparatus shown in FIG. 1, such that different RF powers therefrom are respectively applied to RF antennas 146a and 146b of the two systems through matching circuits 144a and 144b. With the RF antennas of plural systems, as shown in FIG. 3, it is possible to arrange the RF antennas to have a higher density and/or to apply a higher RF power at a place where plasma is apt to have a lower density, and on the other hand, to arrange the RF antennas to have a lower density and/or to apply a lower RF power at a place where plasma is apt to have a higher density, so that plasma generated in the process room has a uniform density.

Figure 10:
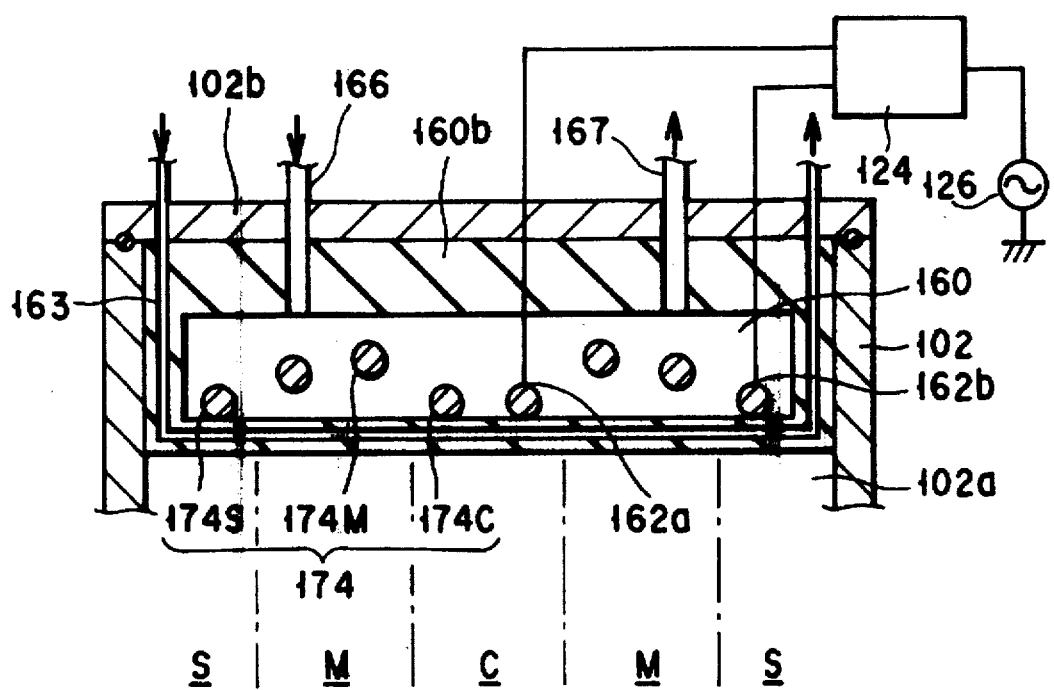
FIG. 10 is a cross sectional view showing the main part of a modification of the etching apparatus shown in FIG. 8.

In a modification shown in FIG. 10, an intermediate portion 174M of an RF antenna 174 of a spiral arranged in a antenna room 160 is separated from a wall 160a of the antenna room 160, which faces a substrate L. In other words, a distance between the intermediate portion 152M and the substrate L mounted on a work table 106 is set larger than distances between an central portion 174C positioned in contact with the wall 160a near a terminal 162a and the substrate L, and a peripheral portion 174S positioned in contact with the wall 160a near a terminal 162b and the substrate L. With this arrangement, it is possible to weaken an electric field in the intermediate region (M) of the process room, where plasma is apt to have a higher density. As a result, plasma generated in the process room has a uniform density, and planar uniformity of etching rate (ER) is increased.

Figure 11:
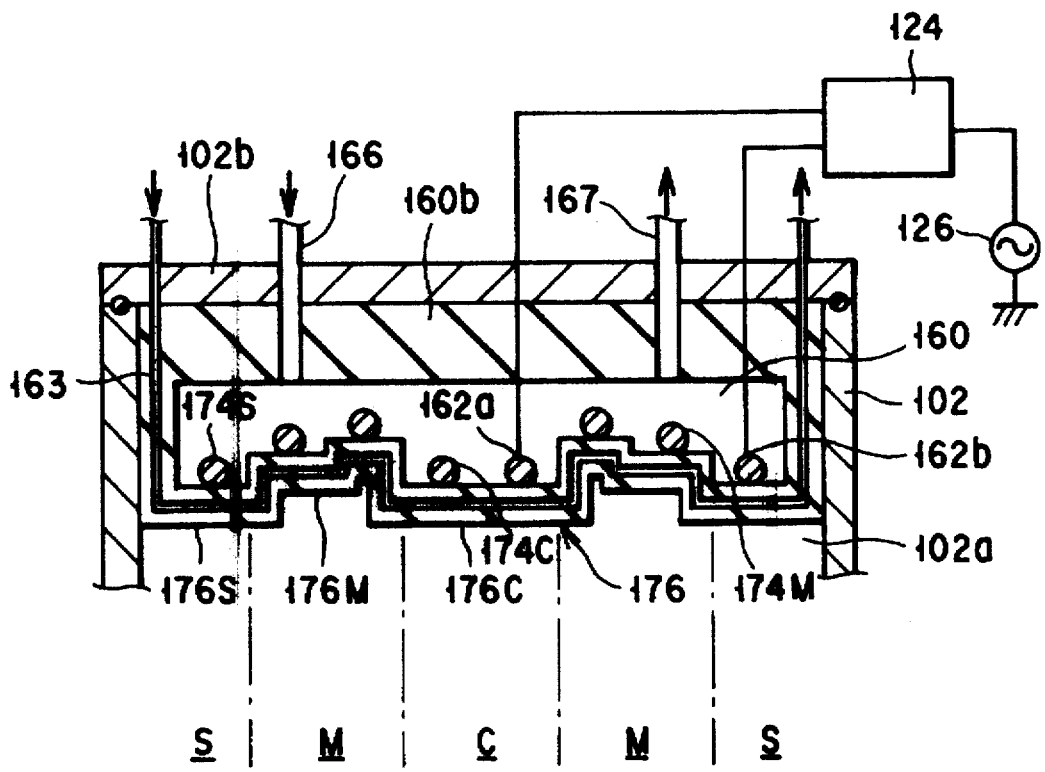
FIG. 11 is a cross sectional view showing the main part of another modification of the etching apparatus shown in FIG. 8.

In a modification shown in FIG. 11, a wall 176 of an antenna room 160, which faces a substrate L, is formed to have steps in accordance with positions of an RF antenna 174, so that the antenna 174 is stably installed. In other words, a portion 176M corresponding to an intermediate region M is projected toward the ceiling of a process room, as compared to the other portions, such as portions 176C and 176S corresponding to central and peripheral regions (C) and (S). The turns of the antenna 174 are respectively placed on the portions 176C, 176M and 176S of the wall 176.

In a modification shown in FIG. 12, a wall 178 of an antenna room 160, which faces a substrate L, is formed such that its thickness is larger at an intermediate portion 178M than at central and peripheral portions 178C and 178S. The bottom surface of the wall 178 is flat and substantially parallel to the substrate L. In other words, the thickness of a dielectric body of the intermediate portion 178M is larger than those of dielectric bodies of the central and peripheral portions 178C and 178S. With this arrangement, it is possible to decrease a transmitted RF energy in the intermediate region (M) where plasma is apt to have a higher density, so that plasma generated in the process room has a uniform density.

In the modification shown in FIG. 12, the outer surface of the antenna room 160 facing the substrate L is flat while the inner surface is projected in the antenna room 160, so that the intermediate portion 178M is thicker. However, it is possible to form in an opposite manner, such that the inner surface of the antenna room 160 is flat while the outer surface is projected toward the substrate L.

Further in the modification shown in FIG. 12, a process gas supply passage 180 is formed in the wall 178 of the antenna room 160, which faces the substrate L. A number of holes 182 communicating with the gas passage 180 are formed in the wall 178 to have openings on the outer surface facing the substrate L. With this arrangement, since a process gas is uniformly spouted out from the process gas supply holes 172a into the process room 102a, uniformity of a process gas density in the process room 102a is increased. As a result, plasma having a uniform density is generated in the process room 102a.

With a plasma processing apparatus according to the embodiment, which has been described with reference to FIGS. 8 to 12 exemplifying the etching apparatus, excellent advantages are obtained as follows:

Since an antenna room is arranged in a process room and can be kept at a pressure lower than the atmospheric pressure, side walls of the antenna room can be thinner than a dielectric body used in a conventional apparatus for separating the atmosphere and a low pressure inside of a process room. As a result, an RF energy applied from an RF power supply is effectively transmitted to the inside of the process room. Further, since a side wall of the antenna room is in contact with a side wall of the process room, which is grounded, an electric field generated by an RF power can be concentrated on an opposite surface, i.e., a surface facing a target object, so that plasma having a high density is generated.

An RF antenna heated by application of an RF energy from the RF power supply can be cooled by an antenna room gas. The inside of the antenna room can be set at a predetermined pressure lower than the atmospheric pressure by adjusting the supply rate and exhaust rate of the antenna room gas.

Since a wall of the antenna room facing the target object is thinner than walls of the antenna room facing walls of the process room, an electric field having a high density is formed toward the target object by an RF power. As a result, an applied RF energy is effectively used and plasma having a high density is generated.

A distance between the RF antenna and the target object may be set larger at an intermediate region of the process room, where an electric field is apt to be intensified, so that the intensity of the electric field is uniform between the intermediate region and central and peripheral regions. As a result, plasma generated in the process room has a uniform density.

The thickness of a dielectric body may be set larger at the intermediate region of the process room, where an electric field is apt to be intensified, so that a transmitted RF energy is decreased at the intermediate region. With this arrangement, plasma generated in the process room is controlled to have a uniform density between the intermediate region, where the plasma is apt to have a high density, and the central and peripheral regions.

Process gas supply means may be arranged in the wall of the antenna room facing the target object, so that a process gas is fed into the process room through, e.g., gas supply holes arranged on the surface facing the target object. With this arrangement, the process gas has a uniform distribution density, and plasma generated in the process room has a uniform density.

A coolant passage may be formed in the wall of the antenna room facing the target object for allowing a coolant to flow. With this arrangement, the antenna room, which may be overheated, is cooled down by, e.g., cooling water flowing in the coolant passage.

Figure 13:
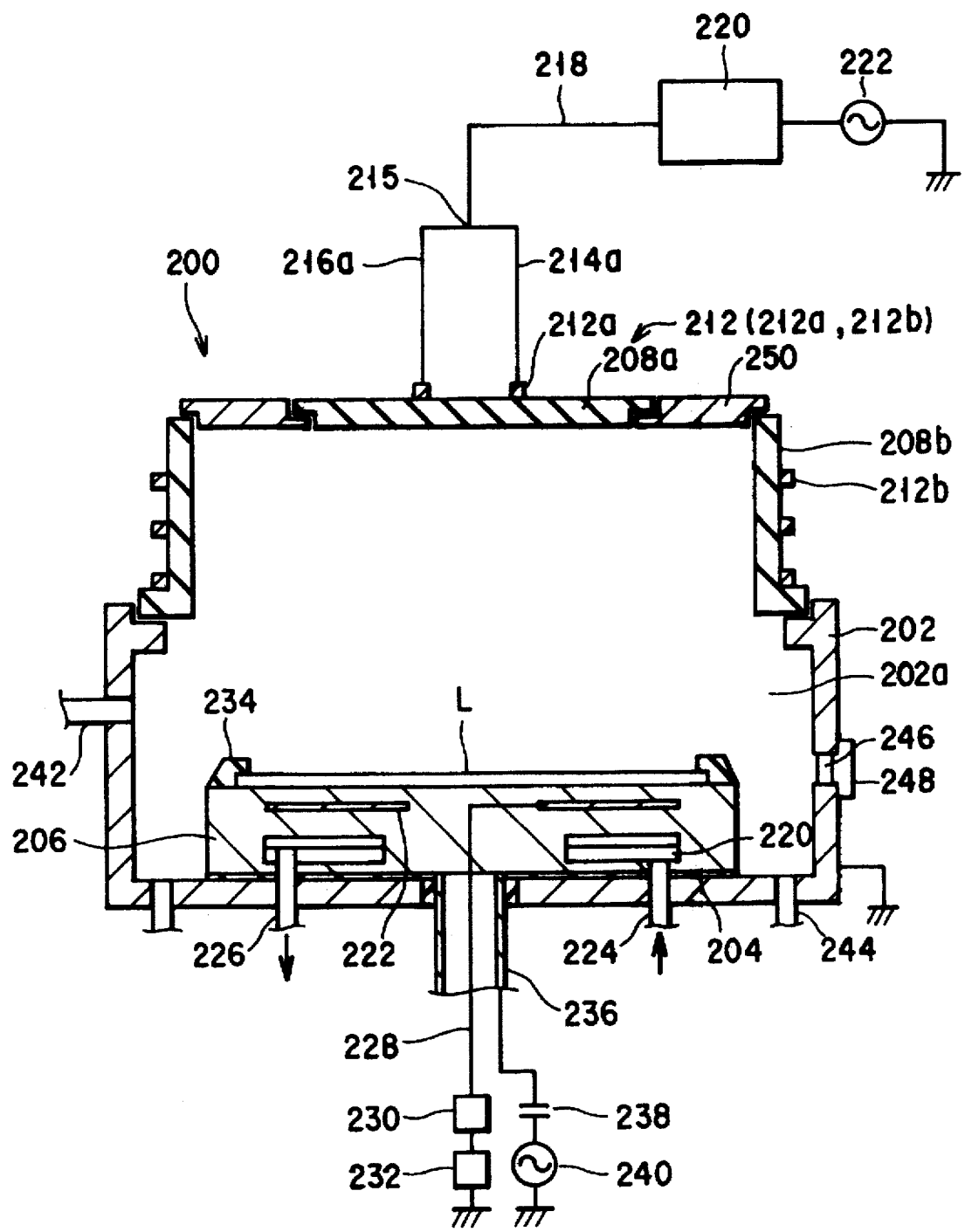
FIG. 13 is a cross sectional view showing an etching apparatus of an LCD substrate, which is an application of a plasma processing apparatus according to still another embodiment of the present invention.

FIG. 13 is a cross sectional view showing an etching apparatus of an LCD substrate, which is an application of a plasma processing apparatus according to still another embodiment of the present invention.

Figure 14:
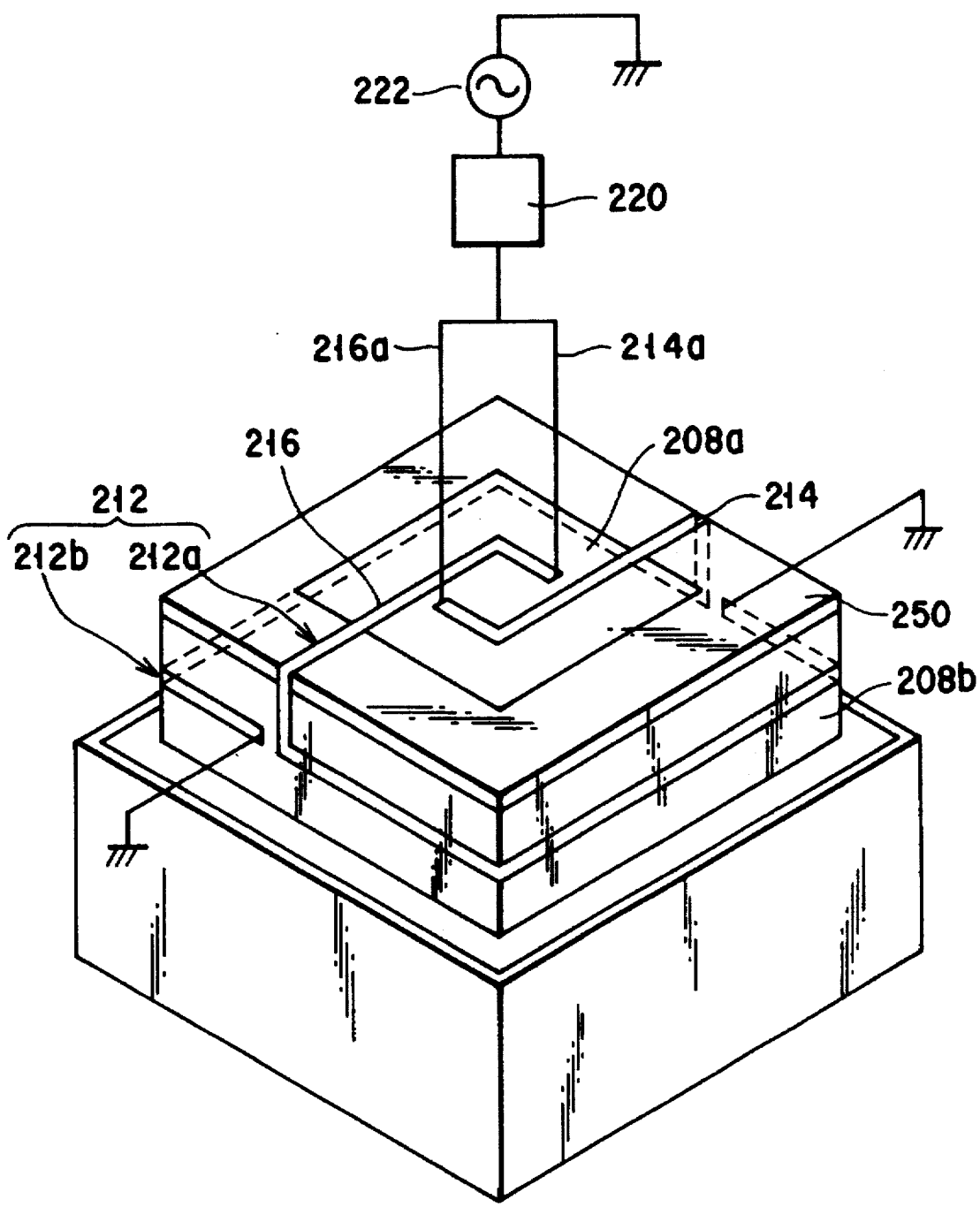
FIG. 14 is a perspective view showing the etching apparatus shown in FIG. 13.
Figure 17:
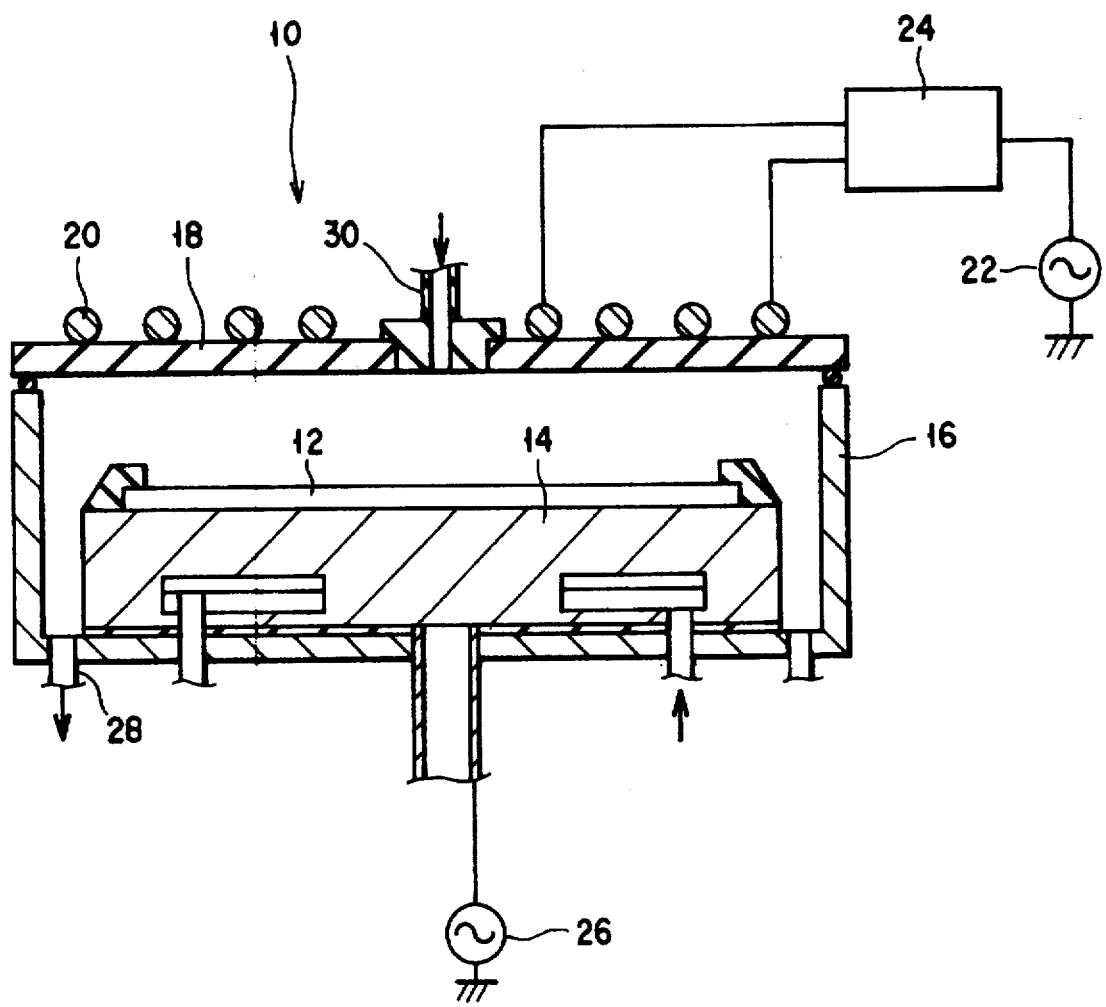
FIG. 17 is a cross sectional view schematically showing a conventional plasma processing apparatus of the RF induction coupling type.

The plasma etching apparatus 200 shown in FIG. 13 has a process container 202 made of a conductive material, such as aluminum, and having a rectangular box shape (see FIGS. 14 and 15). A predetermined etching process is performed in a process room 202a formed in the process container 202.

The process container 102 is grounded. A work table 206 having an essentially rectangular shape is arranged on the bottom in the process container 202 through an insulating plate 204 made of, e.g., ceramics, for mounting a target object, such as an LCD substrate L. A first dielectric member 208a, made of, e.g., quartz glass or ceramics, is arranged through a seal member (not shown) in an airtight fashion at the center of the ceiling plate of the process container 202, which faces the mount surface of the work table 206 for mounting the substrate L. An upper RF antenna section 212a, made of a conductive material, such as copper, aluminum, or stainless steel, is arranged on the outer surface of the first dielectric member 208a.

A shield member 250 made of a conductive material, such as aluminum, is arranged around the first dielectric member 2 at the center of the ceiling plate, as shown in FIG. 13. A second dielectric member 208b, made of, e.g., quartz glass or ceramics, is arranged vertical or perpendicular to the first dielectric member 208a so as to surround the shield member 250. A side RF antenna section 212b made of, e.g., copper or aluminum, is arranged around the outer surface of the second dielectric member 208b.

As described above, an RF antenna 212 according to this embodiment constituted, in terms of arrangement positions, by the upper RF antenna section 212a arranged on the first dielectric member 208a and the side RF antenna section 212b arranged on the second dielectric member 208b.

The RF antenna 212 (212a and 212b) according to this embodiment will be explained in terms of its shape. As shown in FIG. 14, the RF antenna 212 (212a and 212b) is constituted by a first RF antenna member 214 and a second RF antenna member 216. The RF antenna members 214 and 216 form their turns in the same direction, such as counterclockwise as shown in FIG. 14, so that they do not overlap each other.

In this specification, "turn" of an RF antenna includes a case where the number of gyrations or rotations of an antenna having a spiral, coil, or loop shape is less than one, such as ½ or ¾, as well as a case where the number of the gyrations or rotations is one or more. A turn of an RF antenna is not limited to a curve, but may have corners formed of a combination of linear portions. In short, a turn shape of an RF antenna according to the present invention includes all the different shapes of antennas except a single linear antenna.

The shape of the RF antenna 212 (212a and 212b) according to this embodiment will be further described in detail with reference to FIGS. 14 and 15. The RF antenna 212 (212a and 212b) has a common electric supply point 215 above the substantial center of the first dielectric member 208a. The common electric supply point 215 is connected to an RF power supply 222 for generating plasma, by a common lead line 218 through a matching circuit 220.

The RF antenna 212 (212a and 212b) branches at the common electric supply point 215 and is divided into the first and second antenna members 24 and 216. Branch portions 214a and 216a of the antenna members extend from the common electric supply point 215 to the top surface of the first dielectric member 208a of the process container 202 or a position near there, and then first turn portions 214b and 216b are respectively formed to turn counterclockwise.

As described above, the RF antenna 212 (214 and 216) has the branch portions 214a and 216a extending from the common electric supply point 215, which is located above and separated from the dielectric body 208, to the top surface of the first dielectric member 208a of the process container 202 or a position near there. The density of plasma generated in the process room 202a is influenced by a position of the branch portions 214a and 216a. For example, if the branch portions are arranged above the center of the process room 202a to balance right and left with each other, plasma having a uniform density is generated.

As shown in a plan view of FIG. 15, the first and second RF antenna members 214 and 216 include the first turn portions 214b and 216b turning counterclockwise from the branch portions 214a and 216a, extending portions 214c and 216c extending radially from the ends of the first turn portions 214b and 216b, and second turn portions 214d and 216d turning counterclockwise from the ends of the extending portions 214c and 216c. The second turn portions 214d and 216d are grounded at their ends.

In other words, the upper antenna section 212a is formed of part of the branch portions 214a and 216a, the first turn portion 214b and 216b, and part of the extending portions 214c and 216c, among the first and second antenna member 214 and 216. On the other hand, the side antenna section 212b is formed of part of the extending portions 214c and 216c, and the second turn portions 214d and 216d. Such division of the RF antenna 212 is done as a matter of convenience for explaining and understanding the present invention.

The turn shapes of the RF antenna members 214 and 216 are decided on the basis of the contour shape, as indicated by broken lines L in FIG. 15, of a substrate to be processed. More specifically, the RF antenna members 214 and 216 are respectively formed to have a rectangular turn shape consisting of linear portions and corner potions so as to conform with the substrate having a substantially rectangular contour shape in a plan view. Where a semiconductor wafer having a substantially circular shape in a plan view is used as a target object to be processed, an antenna having a circular turn shape may used.

The side RF antenna member 212b, which is formed mainly of the second turn portions 214d and 216d of the RF antenna members 214 and 216, and arranged around the second dielectric member 208b, should be placed outward in relation to the substrate L mounted on the work table 206. With this arrangement, a sufficient etching process can be given to the peripheral portion of the substrate L, especially to its corner portions, where a sufficient etching rate cannot be obtained in a conventional apparatus.

In the modification shown in FIG. 15, the RF antenna 212 is formed of the first and second RF antenna members 214 and 216, in order to simplify the drawings and allow the present invention to be easily understood. Further, the first turn portions 214b and 216b are respectively formed of nearly right angle corners with about ¾ turns, while the second turn portions 214d and 216d are respectively formed of nearly right angle corners with about ½ turns. However, the present invention is not limited to this structure. For example, the RF antenna 212 may be formed of a single RF antenna member, or three RF antenna members or more. The number of gyrations or rotations of the first and second turn portions can be freely changed, if necessary.

The core point of this embodiment is that a used RF antenna member has a first turn portion for controlling a plasma density at the central region and a second turn portion for controlling a plasma density at the peripheral region. The number of RF antenna members, the number of gyrations or rotations, and the turn shape can be freely designed in accordance with the shape and size of a target object, so that plasma having a uniform density is generated in the process room.

The explanation on the structure of the plasma processing apparatus 200 will be continued about the other parts, while an operation of the RF antenna 212 will be described later with reference to FIG. 16.

The work table 206 can be assembled by connecting a plurality of parts made of, e.g., aluminum, with bolts and the like. Temperature control means including, e.g., cooling means 220 and heating means 222, is arranged in the work table 206 for setting the target surface of the substrate L at a predetermined temperature.

The cooling means is formed of, e.g., a cooling jacket. A coolant, such as liquid nitrogen, can be fed into the cooling jacket through a coolant supply pipe 224. The liquid nitrogen fed into the cooling means 220 generates cold by means of nucleate boiling, while circulating in the cooling means 220. With this arrangement, the cold of the liquid nitrogen, such as $-196°$ C. is transmitted from the cooling means 220 to the substrate L through the work table 206, so that the target surface of the substrate L is set at a predetermined temperature. Nitrogen gas generated by means of nucleate boiling of the liquid nitrogen is exhausted out of the container through a coolant exhaust pipe 226.

The heating means 222 is arranged in the work table 206. For example, the heating means 222 is formed such that a conductive heating resistor, such as tungsten, is inserted into an insulating sintered body, such as aluminum nitride. The heating resistor is supplied with a certain power from a power supply 232 through a power supply lead via a filter 230 so as to emit heat. By doing so, the temperature of the target surface of the substrate L is heated up to a preferable temperature, so that its temperature control can be performed.

Clamp means 234 is arranged around the work table 206 to conform with the contour shape of the substrate. The substrate mounted on the work table 206 is held, while being clamped at, e.g., its four corners.

An electric supply rod 236 formed of a hollow conductive body is connected to the work table 206. An RF power supply 240 is connected to the electric supply rod 236 through a blocking capacitance 238. When a process is performed, an RF power of, e.g., 2 MHz is applied to the work table 206 so as to provide a bias potential in relation to plasma. By doing so, a plasma flow is effectively attracted to the target surface of the substrate. Although the apparatus shown in FIG. 13 is constituted such that an RF power for the bias potential is applied to the work table 106, the apparatus may be constituted such that the work table 106 is simply grounded.

A process gas supply port 242 is arranged in a side wall of the process container 202. A predetermined process gas, such as HCl gas, is fed into the process room 202a from a gas source (not shown ) through a mass flow controller (not shown).

An exhaust pipe 244 is connected to the bottom of the process container 202, so that the inside of process container 202 is exhausted by exhaust means (not shown), such as a vacuum pump. The inside atmosphere of the process room 202a can be set at an arbitrary vacuum pressure by exhausting the process room 202a by the exhausting means.

An opening 246 is formed in a side wall of the process container 202 for loading and unloading a target substrate. The opening 246 is provided with a gate valve 248, though which a new substrate L is loaded into the process room 202a from an adjacent load lock chamber (not shown) by transfer means having, e.g., a transfer arm (not shown), and a processed substrate L is unloaded from the process room 202a.

An explanation will be given in terms of an operation of the plasma etching apparatus shown in FIG. 13.

At first, an LCD substrate L to be processed is loaded into the process room 202a by the transfer arm (not shown) through the gate valve 248. Then, the substrate L is mounted on the mount surface of the work table 206 and fixed by the clamping means 234.

The process room 202a is vacuum-exhausted by the vacuum pump (not shown) connected to the exhaust pipe 244, while a predetermined process gas, such as HCl, is fed into the process room 202a through the process gas supply port 242 arranged on a side wall. By doing so, the inside of the process room 202a is kept at a low pressure, such as about 10 mTorr.

An RF energy of, e.g., 13.56 MHz is applied to the RF antenna 212 (214 and 216) from the RF power supply 222 through the matching circuit 220. An electric field is formed in the process room 202a by means of induction caused by an inductance component of the RF antenna 212 (214 and 216). At this time, in this embodiment, a plasma density at the central region of the process room 202a is controlled by the blanch portions 214a and 216a, and the first turn portions 214b and 216b, while a plasma density at the peripheral region of the process room 202a is controlled by the second turn portions 214d and 216d. As a result, plasma is generated in the process room 202a, such that it has a uniform density over the entirety of the target surface of the substrate. It follows that, as shown in FIG. 16, an etching rate (ER) according to this embodiment is improved to have an excellent planar uniformity over the entirety of the target surface of the substrate, as compared to a conventional apparatus.

The plasma thus generated in the process room 202a is moved toward the substrate L mounted on the work table 206 by a bias potential applied to the work table 206. The target surface of the substrate L is subjected to a predetermined etching process with the plasma. After the etching process is completed, the processed LCD substrate L is unloaded to the load lock chamber through the gate valve 248.

Although an LCD substrate is processed as a target object in the above described embodiments, the present invention can be applied to a processing apparatus in which a semiconductor wafer is processed as a target object. Further, although the present invention is applied to an etching apparatus in the above described embodiments, the present invention can be applied to other apparatuses using plasma, such as an ashing apparatus, a plasma CVD apparatus, and the like.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus for processing a target substrate, using a plasma, comprising:

a container forming an airtight process room;

a work table arranged in said process room for supporting said target substrate;

a main exhaust for exhausting and setting said process room at a vacuum;

an antenna block arranged in said process room and having a first layer of dielectric which faces said work table;

an RF antenna embedded in said first layer of dielectric for generating an electric field in said process room;

a power supply section for applying an RF power to said RF antenna; and a main supply for supplying a process gas into said process room from a position between said antenna and said work table, at least part of said process gas being turned into said plasma by said electric field;

wherein said first layer of dielectric is formed of a dielectric material powder in which said RF antenna is embedded.

2. The apparatus according to claim 1, wherein said process container consists essentially of a conductive material.

3. The apparatus according to claim 2, further comprising grounding means for grounding said container.

4. The apparatus according to claim 1, wherein said main supply includes a plurality of gas supply holes arranged on a surface of said antenna block, which faces said work table, and said process gas is supplied into said process room from said gas supply holes.

5. The apparatus according to claim 3, wherein said antenna block includes a second layer of dielectric, which is made of a material different from that of said first layer of dielectric, such that said second layer is interposed between said first layer of dielectric and an inner surface of said process container.

6. The apparatus according to claim 5, wherein said second layer of dielectric is in contact with said inner surface of said process container.

7. The apparatus according to claim 1, wherein said dielectric material powder comprises mica.

8. A plasma processing apparatus for processing a target substrate, using a plasma, comprising:

a container forming an airtight process room;

a work table arranged in said process room for supporting said target substrate;

a main exhaust for exhausting and setting said process room at a vacuum;

an antenna block arranged in said process room and having a first layer of dielectric which faces said work table;

an RF antenna embedded in said first layer of dielectric for generating an electric field in said process room;

a power supply section for applying an RF power to said RF antenna; and a main supply for supplying a process gas into said process room from a position between said antenna and said work table, at least part of said process gas being turned into said plasma by said electric field;

wherein said RF antenna comprises a spiral coil which has a plurality of notches for absorbing thermal expansion of said spiral coil.

9. A plasma processing apparatus for processing a target substrate, using a plasma, comprising:

a container forming an airtight process room;

a work table arranged in said process room for supporting said target substrate;

a main exhaust for exhausting and setting said process room at a vacuum;

an antenna block arranged in said process room and having a first layer of dielectric which faces said work table;

an RF antenna embedded in said first layer of dielectric for generating an electric field in said process room;

a power supply section for applying an RF power to said RF antenna; and a main supply for supplying a process gas into said process room from a position between said antenna and said work table, at least part of said process gas being turned into said plasma by said electric field;

wherein said RF antenna comprises a plurality of antenna elements independent of each other, while said power supply section comprises a plurality of power supplies respectively connected to said antenna elements for applying different RF powers, so as to cause said electric field generated in said process room to be uniform in a plane parallel to said target substrate supported by said work table;

the apparatus further comprising an electric field shield arranged between said antenna elements.

10. A plasma processing apparatus for processing a target substrate, using a plasma, comprising:

a container forming an airtight process room;

a work table arranged in said process room for supporting said target substrate;

a main exhaust for exhausting and setting said process room at a vacuum;

an antenna block arranged in said process room and having a first layer of dielectric which faces said work table;

an RF antenna embedded in said first layer of dielectric for generating an electric field in said process room;

a power supply section for applying an RF power to said RF antenna; and a main supply for supplying a process gas into said process room from a position between said antenna and said work table, at least part of said process gas being turned into said plasma by said electric field;

wherein said RF antenna comprises a plurality of portions arranged to have different distances from said target substrate supported by said work table, so as to cause said electric field generated in said process room to be uniform in a plane parallel to said target substrate supported by said work table; and wherein said antenna block is arranged such that thickness of dielectric interposed between said plurality of portions of said RF antenna and said substrate supported by said work table becomes large, with an increase in said distances of said plurality of portions of said RF antenna from said substrate supported by said work table.

11. A plasma processing apparatus for processing a target substrate, using a plasma, comprising:

a container forming an airtight process room;

a work table arranged in said process room for supporting said target substrate;

a main exhaust for exhausting and setting said process room at a vacuum;

a casing of dielectric arranged in said process room and forming an airtight antenna room which faces said work table;

an RF antenna arranged in said antenna room for generating an electric field in said process room;

a power supply section for applying an RF power to said RF antenna;

a main supply for supplying a process gas into said process room from a position between said antenna and said work table, at least part of said process gas being turned into said plasma by said electric field; and an auxiliary exhaust for exhausting and setting said antenna room at a vacuum;

wherein said RF antenna comprises a plurality of antenna elements independent of each other, while said power supply section comprises a plurality of power supplies respectively connected to said antenna elements for applying different RF powers, so as to cause said electric field generated in said process room to be uniform in a plane parallel to said target substrate supported by said work table;

the apparatus further comprising an electric field shield arranged between said antenna elements.

12. The apparatus according to claim 11, further comprising a pressure controller connected to said auxiliary exhaust for keeping a difference in pressures between said process and antenna rooms smaller than a certain value.

13. The apparatus according to claim 12, wherein said pressure controller is connected to said main exhaust.

14. The apparatus according to claim 12, further comprising an auxiliary supply for supplying an inactive gas into said antenna room.

15. The apparatus according to claim 14, wherein said inactive gas supplied into said antenna room is a coolant, by which said RF antenna is cooled.

16. The apparatus according to claim 11, wherein said process container consists essentially of a conductive material.

17. The apparatus according to claim 16, further comprising grounding means for grounding said container.

18. The apparatus according to claim 11, wherein said main supply includes a plurality of gas supply holes arranged on a surface of said casing of dielectric, which faces said work table, and said process gas is supplied into said process room from said gas supply holes.

19. The apparatus according to claim 16, wherein said container of dielectric is in contact with an inner surface of said process casing.

20. The apparatus according to claim 16, wherein said container of dielectric has a first wall facing said work table and a second wall facing an inner surface of said process casing, said first wall being thinner than said second wall.

21. A plasma processing apparatus for processing a target substrate, using a plasma, comprising:

a container forming an airtight process room;

a work table arranged in said process room for supporting said target substrate;

a main exhaust for exhausting and setting said process room at a vacuum;

a container of dielectric arranged in said process room and forming an airtight antenna room which faces said work table;

an RF antenna arranged in said antenna room for generating an electric field in said process room;

a power supply section for applying an RF power to said RF antenna;

a main supply for supplying a process gas into said process room from a position between said antenna and said work table, at least part of said process gas being turned into said plasma by said electric field; and an auxiliary exhaust for exhausting and setting said antenna room at a vacuum;

wherein said RF antenna comprises a plurality of portions arranged to have different distances from said target substrate supported by said work table, so as to cause said electric field generated in said process room to be uniform in a plane parallel to said target substrate supported by said work table; and wherein said container of dielectric is arranged such that thickness of dielectric interposed between said plurality of portions of said RF antenna and said substrate supported by said work table becomes large, with an increase in said distances of said plurality of portions of said RF antenna from said substrate supported by said work table.

* * * * *